US010288656B2

(12) United States Patent
Cooper et al.

(10) Patent No.: US 10,288,656 B2
(45) Date of Patent: May 14, 2019

(54) MEASUREMENT STRUCTURES FOR MEASUREMENTS SUCH AS FREQUENCY AND QUALITY FACTORS OF RESONATORS AND OTHER DEVICES, AND APPARATUS COMPRISING THE SAME

(71) Applicant: Nokia Solutions and Networks Oy, Espoo (FI)

(72) Inventors: Steven Cooper, Moorooka (AU); David Hendry, Auchenflower (AU); Chris Boyle, Windsor (AU)

(73) Assignee: Nokia Solutions and Networks Oy, Espoo (FI)

(*) Notice: Subject to any disclaimer, the term of this patent is extended or adjusted under 35 U.S.C. 154(b) by 130 days.

(21) Appl. No.: 15/364,559

(22) Filed: Nov. 30, 2016

(65) Prior Publication Data

US 2018/0149683 A1     May 31, 2018

(51) Int. Cl.
*G01R 27/04* (2006.01)
*G01R 27/26* (2006.01)
(Continued)

(52) U.S. Cl.
CPC ............ *G01R 27/26* (2013.01); *H01P 1/2082* (2013.01); *H01P 5/103* (2013.01); *H01P 5/107* (2013.01);
(Continued)

(58) Field of Classification Search
CPC ........ G01R 27/26; H01P 5/103; H01P 11/007; H01P 11/008; H01P 5/107; H01P 7/06
See application file for complete search history.

(56) References Cited

U.S. PATENT DOCUMENTS

| 6,020,800 | A | 2/2000 | Arakawa et al. |
| 9,641,148 | B2 * | 5/2017 | Seo .................. H03H 7/0161 |

(Continued)

FOREIGN PATENT DOCUMENTS

KR     20110136162 A     12/2011

OTHER PUBLICATIONS

GGB Industries; "Picoprobe Model 35"; 2016; whole document (3 pages).

(Continued)

*Primary Examiner* — Thang X Le
(74) *Attorney, Agent, or Firm* — Harrington & Smith

(57) ABSTRACT

An apparatus includes a measurement structure for performing measurements of an RF device. The measurement structure includes an aperture in a conductive surface of the RF device and a conductive projecting region projecting into the aperture from a conductive perimeter of the aperture and electrically connected to that conductive perimeter. The aperture has a similar width in all dimensions. A combined shape of the aperture and the conductive projecting region does not possess even rotational symmetry about a point where a signal conductor will be placed on the conductive projecting region in order to conduct RF energy between the measurement structure and an external measurement instrument for performing the measurements. The measurement structure may be used for performing measurements of a multimode resonator, the measurements comprising one or more of resonant frequencies and quality factors of resonant modes of the resonator.

19 Claims, 19 Drawing Sheets

(51) Int. Cl.
*H01P 1/208* (2006.01)
*H01P 5/103* (2006.01)
*H01P 5/107* (2006.01)
*H01P 11/00* (2006.01)
*H01P 7/06* (2006.01)

(52) U.S. Cl.
CPC .......... *H01P 11/007* (2013.01); *H01P 11/008* (2013.01); *H01P 7/06* (2013.01)

(56) References Cited

U.S. PATENT DOCUMENTS

2003/0231086 A1* 12/2003 Ishikawa ............... H01P 1/2084
333/219.1
2009/0212718 A1* 8/2009 Kawashima ....... H05B 37/0218
315/297
2012/0206213 A1 8/2012 Kojima et al.
2012/0239210 A1* 9/2012 Jakkula .................. G01N 22/04
700/282
2012/0268153 A1* 10/2012 Nickel ............... G01R 31/3025
324/754.31

OTHER PUBLICATIONS

Spiegel R J et al; "Development of a dual mode, variable volume resonant cavity system"; 1978; whole document (7 pages).
GGB Industries; "Picoprobe Model 40A High Performance Microwave RF Probes"; 2016; whole document (6 pages).
D-Coax; "Omni Probe—High Frequency Coaxial Probe (44GHz) (D-Coax)"; 2016; whole document (1 page).
GGB Industries; "Picoprobe Differential Probes"; 2016; whole document (3 pages).
Sigmarsson H H et al; "In-Situ Control of Tunable Evanescent-Mode Cavity Filters Using Differential Mode Monitoring"; 2009; whole document (4 pages).

* cited by examiner

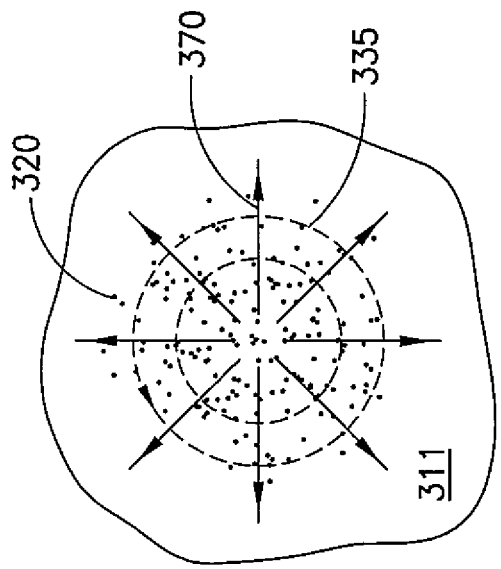
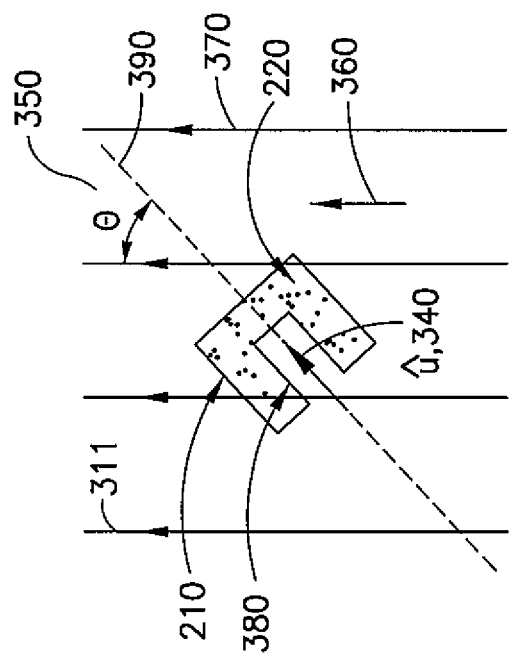
FIG. 3B
FIG. 3A

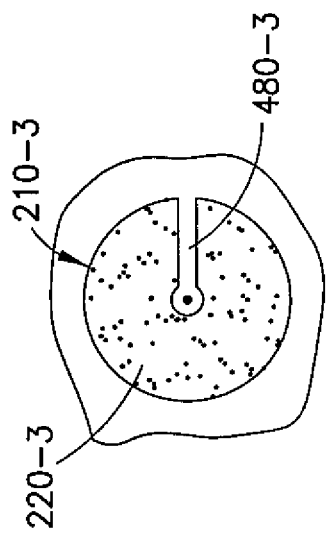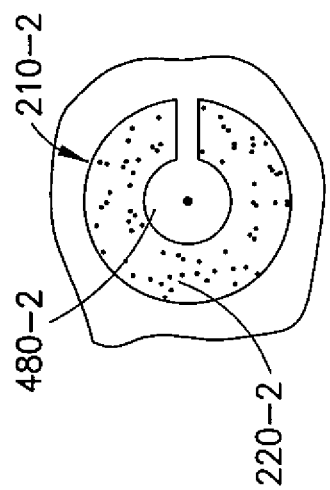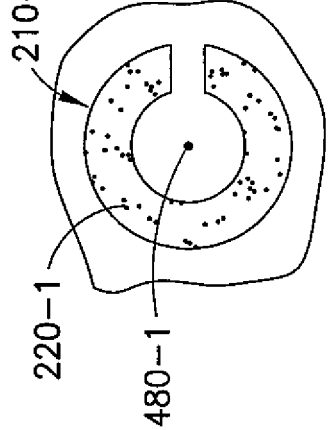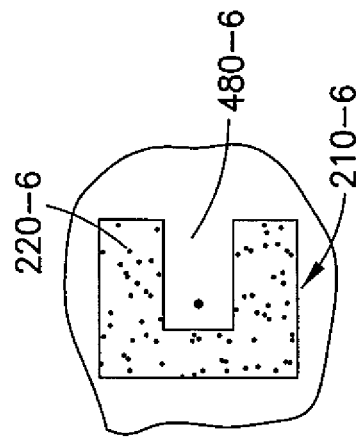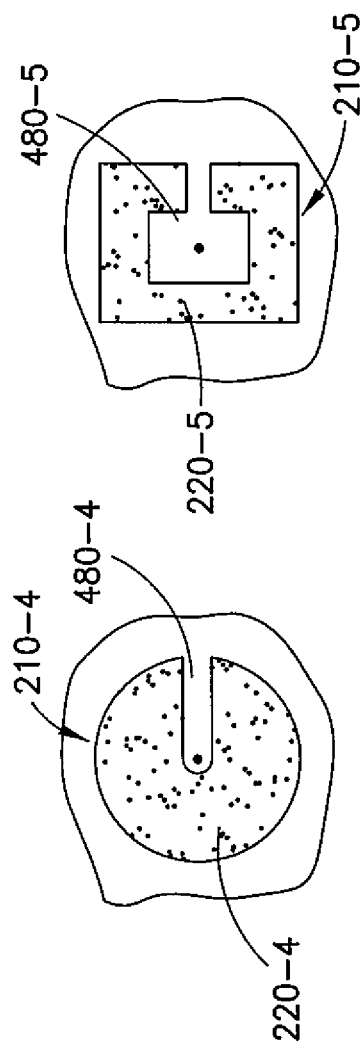

TE011 (X) MODE

ELECTRIC FIELD ON
YZ FACE (E)

MAGNETIC FIELD ON
YZ FACE (H)

SURFACE CURRENT ON
YZ FACE (J)

TE101 (Y) MODE

TE110 (Z) MODE

ELECTRIC FIELD ON
YZ FACE E=0

ELECTRIC FIELD ON
YZ FACE E=0

MAGNETIC FIELD
YZ FACE

MAGNETIC FIELD ON
YZ FACE

SURFACE CURRENT ON
FACE YZ

SURFACE CURRENT ON
FACE YZ

TE021

TE012

TE102

E

E

E FIELD ON YZ FACE

E=0

H

H

H

J

J

J

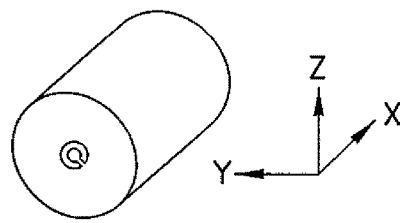
FIG.6A
AXIAL X MODE
TRANSVERSE Y MODE
TRANSVERSE Z MODE
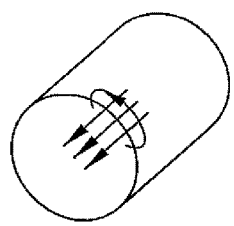
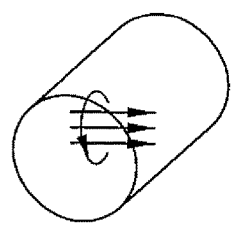
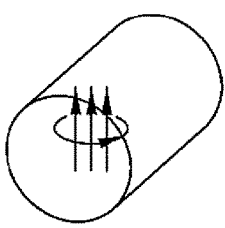
FIG.6B  FIG.6F  FIG.6J
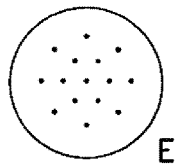
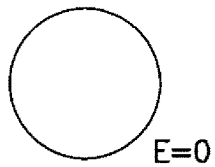
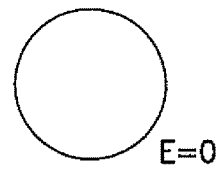
FIG.6C  FIG.6G  FIG.6K
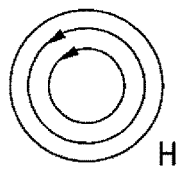
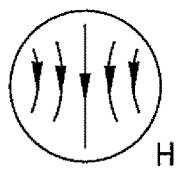
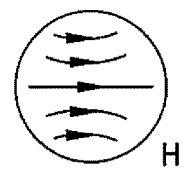
FIG.6D  FIG.6H  FIG.6L
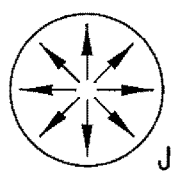
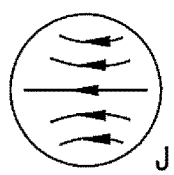
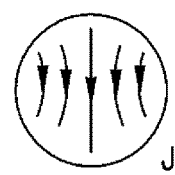
FIG.6E  FIG.6I  FIG.6M

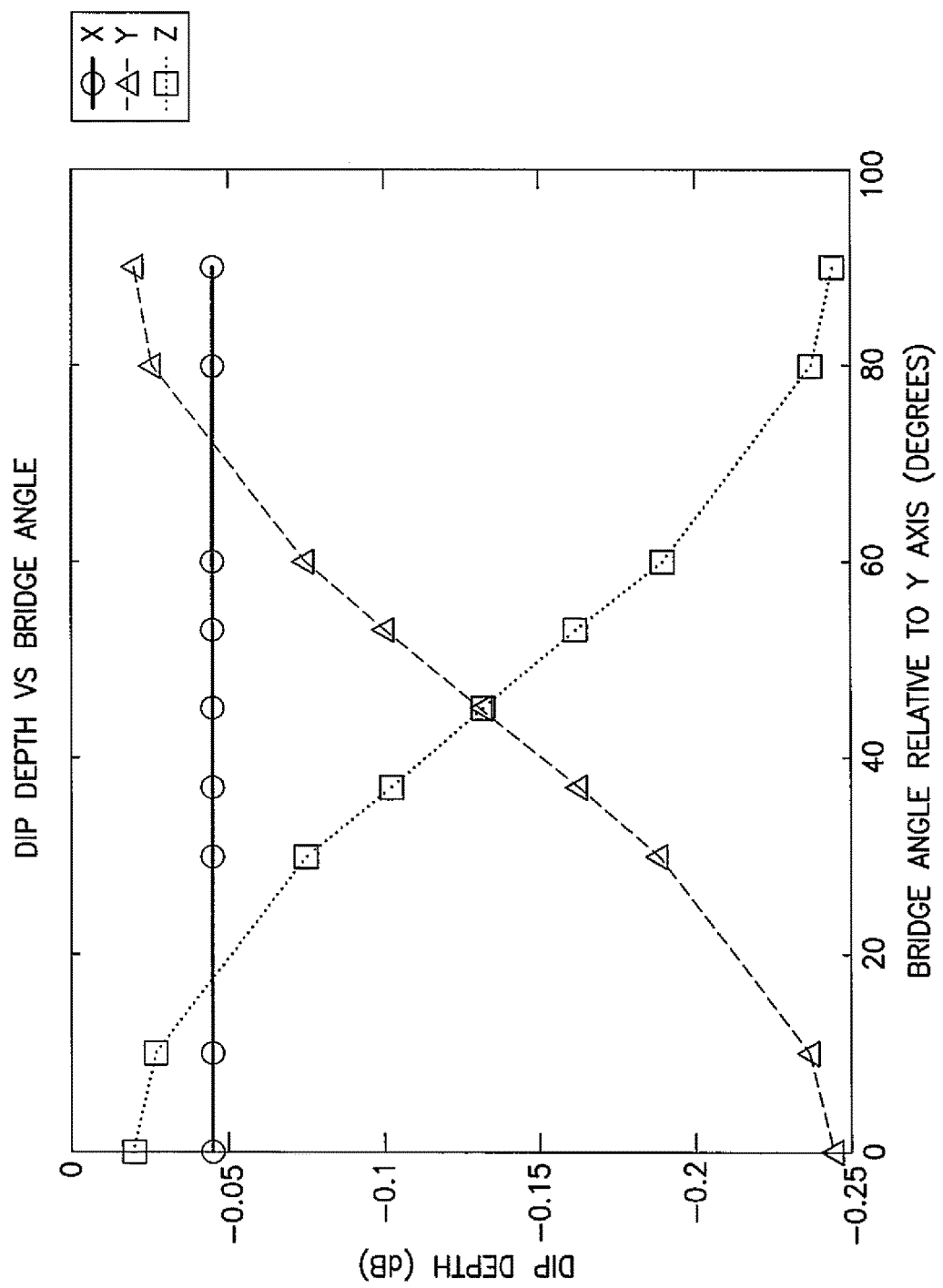

MEASUREMENT STRUCTURES FOR MEASUREMENTS SUCH AS FREQUENCY AND QUALITY FACTORS OF RESONATORS AND OTHER DEVICES, AND APPARATUS COMPRISING THE SAME

TECHNICAL FIELD

This invention relates generally to performing measurements on apparatus such as resonators and, more specifically, relates to a measurement structures for performing these measurements.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

A filter is composed of a number of resonating structures and energy coupling structures which are arranged to exchange RF energy between themselves and the input and output ports. The pattern of interconnection of these resonators to one another and to the input/output ports, the strength of these interconnections and the resonant frequencies of the resonators determine the response of the filter.

During the design process for a filter, the arrangement of the parts, the materials from which the parts are made and the precise dimensions of the parts are determined such that an ideal filter so composed will perform the desired filtering function. If a physical filter conforming exactly to this design could be manufactured, then the resulting filter would perform exactly as intended by the designer.

However, in practice the precision and accuracy of manufacture of both the materials and the parts are limited, and this results in errors in resonant frequencies and coupling strengths which in turn cause the filter response to differ from that predicted by the ideal filter model. Often, this departure from the ideal response is sufficiently large to bring the filter outside of its acceptable specification. As a result, it is desirable to include in the filter design some means of adjusting the resonator frequencies and couplings to bring the filter response within the required specification.

A common way to accomplish this is to include tuning screws or other devices, such as are well known in the art. An alternative way often used in small ceramic monoblock filters is to remove selected portions of the metallization on the exterior of these filters, and possibly portions of ceramic as well, to accomplish the tuning.

Most filters are manufactured as completed units and the tuning process then performed on the entire filter. Since the many adjustments on the filter interact strongly with one another, the tuning procedure is often quite complicated, and requires a skilled operator.

An alternative tuning method is to build the separate resonator parts, tune them individually to a specification calculated for the separated parts from the ideal filter model, and then assemble them into the final filter. Since the individual parts are simple compared with the fully assembled filter, the tuning procedure for these individual parts can also be made very simple. This minimizes the need for skilled operators to tune the filters. This procedure also provides the benefit of either reducing or entirely eliminating the tuning process for the assembled filter.

In many cases it is sufficient to adjust only the resonant frequencies of the resonator parts because the manufacturing precision and accuracy are good enough to bring the coupling strengths within the required range to allow the assembled filter performance to be within specification. In such cases adjustment of the frequencies alone is all that is required to tune the individual parts.

To allow pretuning of the individual parts, both methods of measurement of the frequencies and methods of adjustment of the frequencies are required. In the case where the parts include multimode resonators, the tuning methods for the parts will need to be able to independently adjust the resonant frequencies of the several modes of interest in the resonator. For example, if the resonator is a triple mode resonator, then at least three independent adjustments are needed. The measurement methods will likewise need to be able to measure the resonant frequencies of all of these modes.

A tuning method may include the manipulation of a tuning device or structure included as part of the resonator, such as a tuning screw or deformable metal part. Alternatively, a method may comprise an operation performed on the resonator, such as the removal of material from a selected region. The method may also comprise a combination of these, or any other means or process which can alter the resonant frequencies of the resonator part.

A tuning physical adjustment (commonly abbreviated more simply as "adjustment") can then be defined as one or more manipulations of tuning structures and/or one or more operations causing one or more of the resonant frequencies to be altered. For instance, such physical adjustment includes but is not limited to removal of material from a surface/face, drilling of holes, adjustments of screws, and/or denting of material.

In cases where the parts include multimode resonators, the tuning methods for the parts will need to be able to independently adjust the resonant frequencies of the several modes of the resonator. For example, if the multimode resonator has three modes requiring independent adjustment, then at least three independent tuning adjustments will be required. It is a common situation with multimode resonators that an individual adjustment causes more than one of the mode frequencies to change. As a result, there is not a one-to-one correspondence between a single adjustment and a frequency change in a single mode.

What is needed to allow the multimode part to be easily tuned is a method to calculate the required adjustments to effect the desired changes in the set of mode frequencies. What is also needed is a means to measure the resonant frequencies of all of the modes of interest in a resonator part, including in a multimode resonator part. It is desirable that this method be simple, compact and low cost, and that it be able to measure all of the modes of interest with the same structure or process.

SUMMARY

This section contains examples of possible implementations and is not meant to be limiting.

An apparatus includes a measurement structure for performing measurements of an RF device. The measurement structure includes an aperture in a conductive surface of the RF device and a conductive projecting region projecting into the aperture from a conductive perimeter of the aperture and electrically connected to that conductive perimeter. The aperture has a similar width in all dimensions. A combined shape of the aperture and the conductive projecting region does not possess even rotational symmetry about a point where a signal conductor will be placed on the conductive projecting region in order to conduct RF energy between the measurement structure and an external measurement instrument for performing the measurements. The measurement structure may be used for performing measurements of a multimode resonator, the measurements comprising one or more of resonant frequencies and quality factors of resonant modes of the resonator.

BRIEF DESCRIPTION OF THE DRAWINGS

In the attached Drawing Figures:

FIG. 2, which includes both FIG. 2A illustrates the test structure attached to a face of the filter component and the transmission line connected to the test structure, and where FIG. 2B illustrates the face of the filter component on which the test structure is attached;

FIG. 3 is split into FIGS. 3A and 3B, where FIG. 3A illustrates a track direction vector $\vec{u}$ for a track on a surface of a resonator and the angle (which is shown as θ) between the track direction vector $\vec{u}$ and the current, and FIG. 3B illustrates electric field, current and magnetic field on a surface of the resonator;

FIG. 4, which is split into FIGS. 4A to 4L, illustrates a number of possible measurement structures, where FIGS. 4A, 4B, 4C, and 4D illustrate round islands from a large island (4A) to a smaller island (4B) to an even smaller island (4C) to no island but a rounded conductive region (4D), FIG. 4E illustrates a rectangular island as a conductive region, FIG. 4F illustrates a rectangular track and no island as a conductive region, FIGS. 4G and 4H illustrate C-shaped apertures with rounded tracks as conductive regions, FIG. 4I illustrates an L-shaped track as a conductive region 480-9, FIG. 4J illustrates a J-shaped track as conductive region 480-10, FIG. 4K illustrates a straight track starting from a corner as a conductive region, and FIG. 4L illustrates a C-shaped region with a tear-drop shaped track as a conductive region;

FIG. 5, which is split into FIG. 5A illustrates a cuboid resonator having a measurement structure on a surface, FIGS. 5V, 5W, 5X, and 5Y illustrate fields and currents for the TE102 mode;

5plit into FIGS. 6A to 6M, illustrates fields and currents for a cylindrical resonator, where FIG. 6 illustrates a cylinder having a measurement structure on a surface, FIGS. 6B, 6C, 6D, and 6E illustrate the fields and currents for the axial X mode, and FIGS. 6F, 6G, 6H, and 6I illustrate the fields and currents for the transverse Y mode, and FIGS. 6J, 6K, 6L, and 6M illustrate the fields and currents for the transverse Z mode.

FIG. 7, split into FIG. 7A illustrates a coaxial probe and FIG. 7B illustrates a GSG probe;

FIG. 8, which includes

FIG. 9 is a graph showing dip depth versus (vs) bridge angle for an exemplary embodiment;

FIG. 15, split into FIG. 15A illustrates a contour plot of the electric field induced coupling strength as a measurement structure is moved about the face, FIGS. 15M, 15N, and 15O show contour plots of the magnetic field induced coupling strength as a measurement structure with horizontal track direction (15M), vertical track direction (15N), and 45 degree track direction (15O) is moved about the face, and where contour plots of total coupling strength (electric field induced and magnetic field induced) corresponding to the TE101 and TE 110 are not shown as these plots are the same as the plots for those modes that are shown as the electric field is zero for these modes.

DETAILED DESCRIPTION OF THE DRAWINGS

Figure 1:
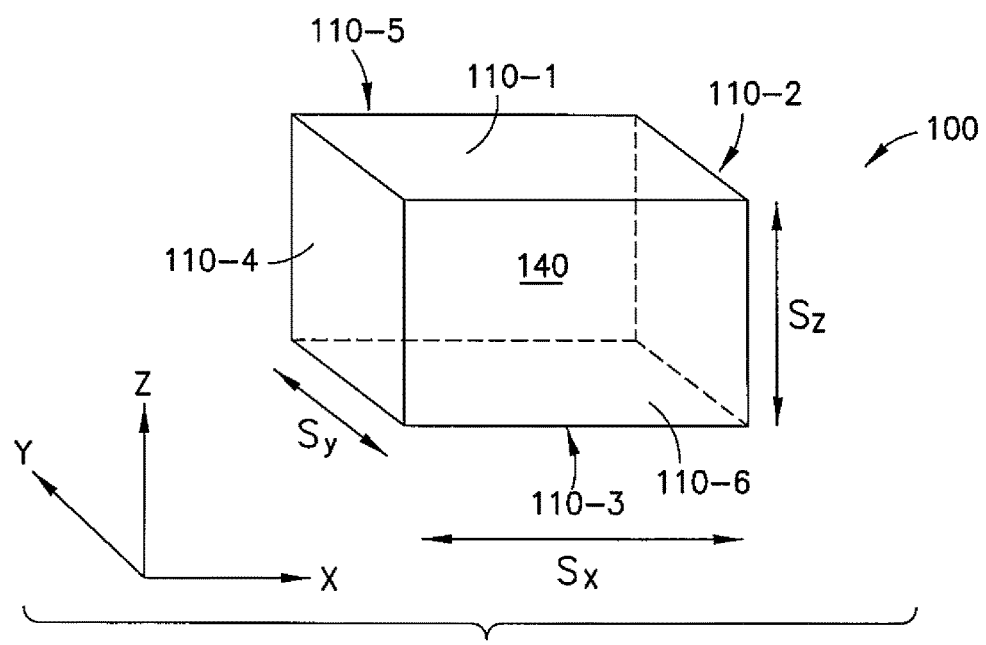
FIG. 1 is an example of a filter component, e.g., used as an example for the methods and techniques described throughout.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above, what is needed to perform tuning operations on individual separated resonant components of a filter is the ability to calculate the desired target frequencies of the separated components, to measure the actual resonant frequencies of the components, and then to perform physical adjustments on the components to bring their actual frequencies into agreement with the target frequencies. Once this is done to the precision and accuracy required for a filter assembled from these tuned components to have a response within specification, the component is considered tuned.

An important aspect of the tuning process is to possess a method to measure the resonant frequencies of the components. In the case where one or more of the components are multimode resonators, then the method must allow frequency measurements of all of the modes of interest. It is also desirable that the measurement method be simple to implement, and capable of measuring all of the modes with a single structure and a single operation.

In order to measure the resonant frequencies of the multimode resonator, it is necessary to affix some kind of measurement device which couples to all of the resonator modes. Such a device needs to be so positioned as to be exposed to portions of the electric and/or magnetic fields of all of the modes of interest in the resonator. The design of the device needs to be such as to permit an exchange of energy with the resonator modes via the abovementioned electric and magnetic fields.

In the case where the resonator component is a metal coated dielectric, a convenient way to implement this device is as a metallic pattern incorporated into the metal coating. Such a pattern may be formed by any of a variety of methods such as etching, laser cutting, sandblasting and screen printing. A test probe such as a coaxial probe or a ground-signal-ground (GSG) probe or similar devices such as known in the art may then be used to connect to the measurement structure.

Any instrument or circuit capable of detecting small variations in absorption or reflectance as a function of frequency may be employed to detect and measure the resonances in the part under test. Examples of such instruments known in the art are vector network analyzers, dip meters, and wave meters.

The presence of a frequency measurement test structure on the multimode resonator slightly shifts or perturbs the frequencies relative to a bare resonator structure. As a result, the target frequencies towards which the part is to be tuned should be calculated to take these shifts into account. This can be done by performing a full 3D electromagnetic calculation, or may be done by perturbation analysis if the resonator has analytic equations for the mode frequencies and the test structure is small.

Even though the frequency perturbations caused by the presence of the measurement structure are included in the target frequencies, it is prudent to design the structure so as to minimize this disturbance. This will then minimize the severity of any errors in the fabrication of the measurement structure. A simple way to minimize the disturbance is to keep the measurement structure as small as possible, consistent with economical fabrication, and consistent with the provision of a large enough signal to be able to measure the frequencies with the desired accuracy and precision.

The fields of interest in a metal coated dielectric resonator with a measurement structure formed in the metal coating are those immediately under the metal coating where it contacts the dielectric. The electric field at this location will be perpendicular to the metal surface while the magnetic field will be parallel to the metal surface. The operation of the measurement structure can thus be understood in terms of its interaction with these fields.

Further, in the case where the measurement structure is small compared with the size of the resonator, the electric and magnetic fields due to the resonator modes will be approximately constant over the extent of the measurement structure. This simplifies the analysis of the interaction between resonator and measurement structure because all that is necessary is to consider the field strengths and directions at the location of the measurement structure.

Introduction to Cuboid Resonators

In order to describe concepts for the measurement structures to be described below in more detail, it is helpful to consider measuring a simple resonator. In particular, consider the case where the multimode resonator is a ceramic block formed into a cuboid shape and covered with a conducting layer such as silver (see FIG. 1). The cuboid component 100 (also called a resonator) includes a dielectric cuboid 140 that has six sides: a top side 110-1, a right side 110-2, a bottom side 110-3, a left side 110-4, a back side 110-5, and a front side 110-6. Each individual side 110 is also considered to be a face of the component 100. The sides 110 are typically covered with conductive material (see FIG. 2A). The X, Y, and Z axes are shown, as are the corresponding dimensions Sx, Sy, and Sz. These axes are used throughout the figures. It is noted that the cuboid is used merely for ease of exposition, and other devices may be measured, as is illustrated below.

Figure 2A:
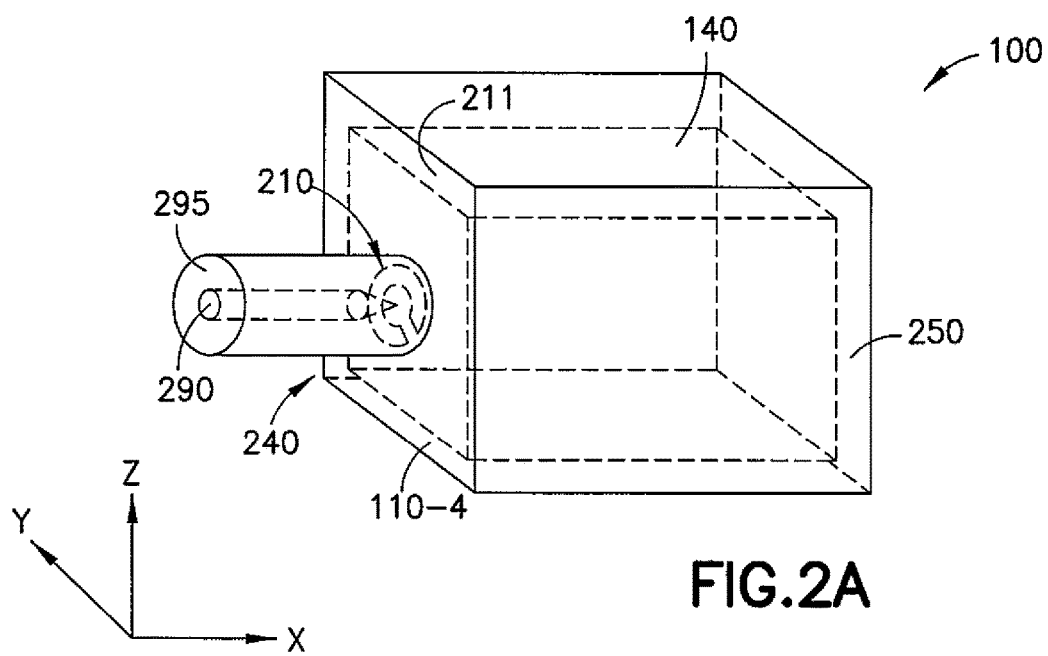
FIGS. 2A and 2B, illustrates the filter component of FIG. 1 with a test structure and transmission line attached, where
Figure 2B:
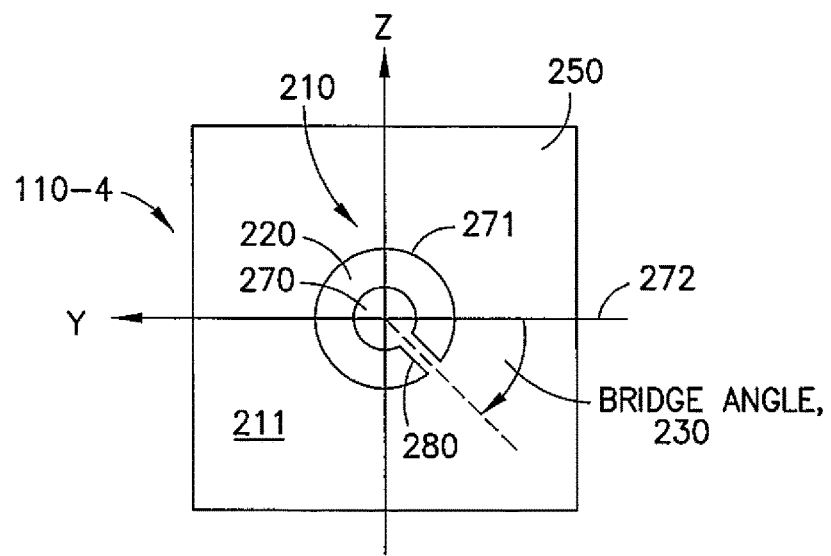

An example of a measurement structure 210 is shown in FIG. 2, and will be referred to as a keyhole or key in some instances herein. FIG. 2 includes both FIGS. 2A and 2B, and illustrates the filter component of FIG. 1 with a keyhole 210 attached. FIG. 2A illustrates the test structure 210 attached to a face 110-4 of the filter component and illustrates a transmission line connected to the test structure 210. FIG. 2B illustrates the face 110-4 of the filter component 100 on which the test structure 210 is attached. The face 110-4 has a surface 211. The filter component 100 has a conductive coating 250 that covers a dielectric cuboid 140. This measurement structure 210 is formed in part as an aperture 220 devoid of metallization in an otherwise continuous coating 250 on the exterior of a ceramic resonator component 100. The measurement structure 210 comprises also a central conductive island 270 with a short conductive bridge 280 connecting the island 270 to the surrounding grounded perimeter 271 (of the coating 250). The center conductor 290 of an external coaxial or similar transmission line 240 is connected to the island 270 of the keyhole 210 and the shield 295 of the transmission line 240 is connected to the grounded perimeter 271 of the keyhole 210. The island 270 couples to any electric field striking the inside surface of the conductive coating 250 in the location of the keyhole structure, while the bridge 280 couples to any magnetic field running parallel to the surface 211 and at any angle not parallel to the bridge 280, also at the location of the keyhole 210. Such a measurement structure 210 will exchange radio frequency (RF) energy with any resonant modes which conform to certain field distributions, as described below, and so will permit the frequencies of those modes to be determined by connecting the above transmission line to a vector network analyzer (VNA) or similar instrument.

How the Signals Vary with Position and Orientation

Turning to FIG. 3, this figure is split into FIGS. 3A and 3B, where FIG. 3A illustrates a track direction vector $\vec{u}$ 340 for a track 380 on a surface 311 of a resonator and the angle 350 (which is shown as θ) between the track direction vector $\vec{u}$ 340 and the current 370 for a measurement structure 210 having the track 380. The reference 360 indicates the current density vector $\vec{J}$. The track direction vector $\vec{u}$ 340 is assumed to run along a centerline 390 of the track 380. For a given measurement structure 210, the relative magnitudes of the electric and magnetic field induced signals will vary as the measurement structure is moved around the resonator surface. They will also vary as the track direction (given by the track direction vector, $\vec{u}$, or equivalently, the track angle θ 350) is varied.

FIG. 3B illustrates electric field 320, current 370, and magnetic field 335 on the surface 311 of the cuboid resonator. Additional description of this figure is provided below.

We will consider the fields 320, 335 and currents 370 associated with several modes of potential interest in various resonators. These fields and currents are all shown at the instant in the cycle when the electric field is directed towards the inside of the surface and is increasing in strength. These can then be used to illustrate how the amplitudes of the electric and magnetic field induced signals and the combined signal vary with different locations for the measurement structure.

Requirements of the Measurement Structure

As mentioned earlier, it is desirable to be able to measure the frequencies of all of the modes of interest with a single structure and a single operation.

To measure a mode frequency, the measurement structure needs to be able to exchange energy with the mode and to do that the measurement structure needs to couple to either or both of the electric and magnetic fields associated with that mode. The first requirement is to open up some kind of aperture in the metal coating so that the internal fields can be accessed.

To exchange energy with the electric field (which is always perpendicular to the inside surface of the metal coating), a conductive region is required in or immediately above or below the abovementioned aperture. This region must be at least partially isolated from the surrounding metal perimeter of the aperture. The oscillating electric field of the mode tries to induce an oscillating electric charge on the partially isolated region. If the region is not isolated then that charge is free to flow into and out of the region, and this flow forms part of the general current flow on the inside surface of the metal coating. However, if the region is at least partially isolated, then the current flow into and out of the region is impeded and consequently an oscillating potential difference forms between the partially isolated region and the surrounding metal perimeter. If the region and perimeter is connected to an external measuring instrument or circuit using for example a coaxial probe, then this potential difference will cause a current to flow in the external circuit, allowing the resonance to be detected and its frequency measured. An example of a suitable isolated region is a conductive island or patch separated from the metal perimeter by a nonconductive gap.

To exchange energy with the magnetic field (which is always parallel to the inside surface of the metal coating), a conductive track or path is required in or immediately above or below the abovementioned aperture. Further, the path must not be parallel to the magnetic field at all points. The path will preferably be at a substantial angle to the magnetic field, and if maximum signal is desired the path will be perpendicular to the magnetic field direction. This path must be at least partially isolated from the surrounding metal perimeter of the aperture. The oscillating magnetic field tries to induce an oscillating current flow in the path. If the path is not isolated, then that current is free to flow in any direction relative to the path, and forms part of the general current flow on the inside surface of the metal coating. However, if the path is at least partially isolated, then the current flow will be constrained to flow along the path, or if the current is impeded from flowing, an oscillating potential difference will be established along the path. If the ends of the path are connected to an external measuring instrument or circuit using for example a coaxial probe, then this induced current will flow in the external circuit, allowing the resonance to be detected and its frequency measured.

An example of a suitable path is an asymmetric conductive region connected (grounded) to the metal perimeter at one end and to the central conductor of the coaxial probe or the signal conductor of the GSG probe at the other end, or partway along. We will refer to the end connected to the metal perimeter as the grounded end and the opposite end connected to the probe as the hot end. This conductive region is isolated from the metal coating by a nonconductive gap except where its grounded end connects to the perimeter.

The asymmetric conductive region should not have even rotational symmetry about any point. By even rotational symmetry, what is meant is N-fold rotational symmetry where N is an even number. Another way to describe what is meant is that there should not exist any point within or outside the measurement structure about which rotation of the structure through an angle 360/N will produce the same structure, where N is an even number.

Figure 7A:
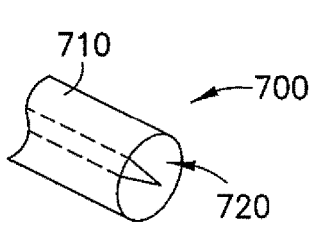
FIGS. 7A and 7B, illustrates two possible probes used to perform measurements in exemplary embodiments, where
Figure 7B:
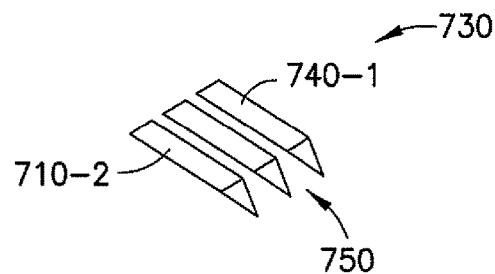

Turning to FIG. 7, split into FIGS. 7A and 7B, this figure illustrates two possible probes used to perform measurements in exemplary embodiments. FIG. 7A illustrates a coaxial probe 700, while FIG. 7 B illustrates a GSG probe 730. The coaxial probe 700 in FIG. 7A comprises a "hot" center (centre) conductor 720 and a shield/grounded connector 710. The GSG probe 730 in FIG. 7B comprises a "hot" center (centre) conductor 750, commonly referred to a signal conductor, and two ground conductors 740-1 and 740-2.

To exchange energy with all of the modes of interest by means of a single structure, in most cases that structure will need to couple to both electric and magnetic fields. Ideally, the design will be such that the magnetic-field-coupled signals and the electric-field-coupled signals will have similar strengths, but it is sufficient that all of the signals be large enough to allow the frequencies to be measured to the required accuracy and precision.

The magnetic field-coupling conductive path described above will also couple to the electric field because the hot end acts as a partially isolated conductive region. The isolation is only partial because the rest of the path provides a way for some of the current to flow to the grounded perimeter. Since the path has non-zero inductance, the current flow is somewhat impeded and so it still develops a potential difference relative to the perimeter and so it can still induce current to flow in the external circuit. Depending on the relative dimensions of the path, the gap and the perimeter, this electric field signal may be much smaller than the magnetic field signal, so it is useful to add an enlarged conductive island or patch to the hot end of the path to increase the magnitude of the electric field signal and so make it easier to detect.

To ensure that all of the modes are detected, each mode needs to have a non-zero electric and/or magnetic field at the location of the measurement structure. If the only means of coupling to a particular mode is via the magnetic field, then the track or path direction must not be parallel to the magnetic field for that mode. Thus, the orientation of the track or path relative to the resonator needs to be such that it is not parallel to the magnetic fields of any of the modes which have negligible electric field at the location of the measurement structure.

Various Possible Structures for the Measurement Structure

Figure 4I:
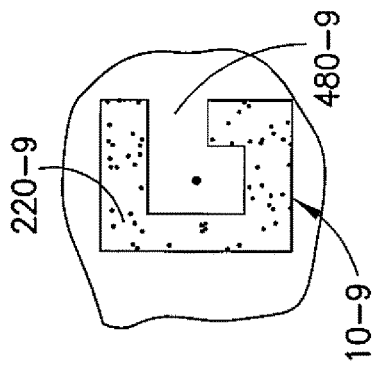
Figure 4L:
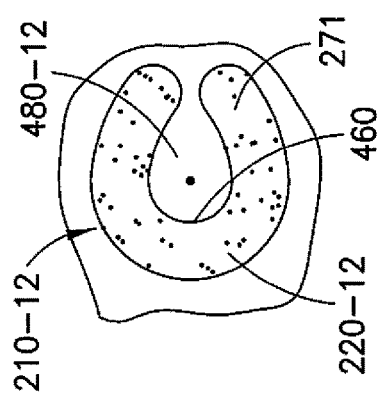
Figure 4H:
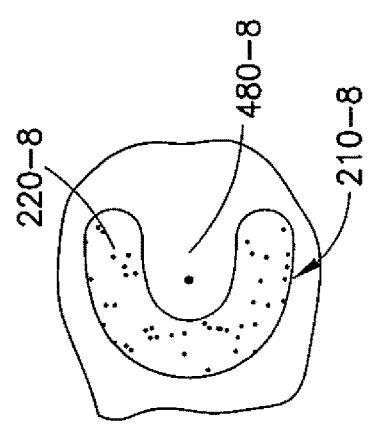
Figure 4K:
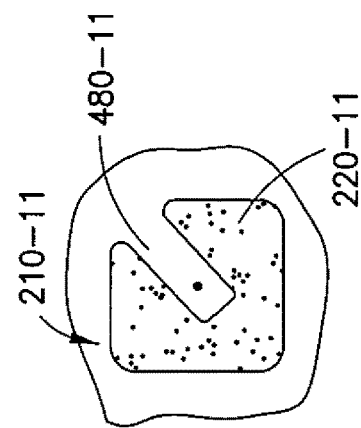
Figure 4G:
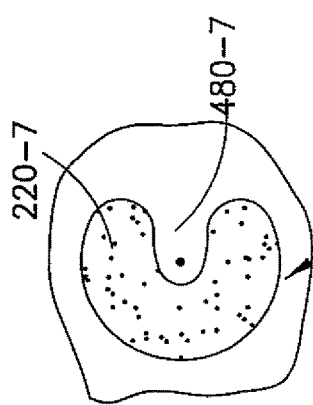
Figure 4J:
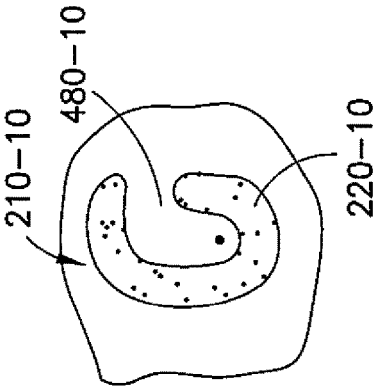

Returning to FIG. 4, which is split into FIGS. 4A to 4L, this figure shows a number of simple measurement structures 210-1 through 210-12, respectively, which conform to the above requirements. They all comprise a corresponding asymmetric conductive region 480-1 through 480-12 inside a corresponding aperture 220-1 through 220-12. FIGS. 4A, 4B, 4C, and 4D illustrate round islands from a large island (4A) with bridge (both 480-1) to a smaller island (4B) with bridge (both 480-2) to an even smaller island (4C) with bridge (both 480-3) to no island but a rounded conductive region 480-4 (4D). FIG. 4E illustrates a rectangular island as a conductive region 480-5. For FIGS. 4A, 4B, 4C, and 4E, each of these has an island that has a width that is larger than a largest width of the corresponding bridge. FIG. 4F illustrates a rectangular track and no island as conductive region 480-6, FIGS. 4G and 4H illustrate C-shaped apertures 220-7 and 220-8 with rounded tracks as conductive regions 480-7 and 480-8, FIG. 4I illustrates an L-shaped track as a conductive region 480-9, FIG. 4J illustrates a J-shaped track as conductive region 480-10, FIG. 4K illustrates a straight track starting from a corner as conductive region 480-11, and FIG. 4L illustrates a C-shaped region 220-12 with a tear-drop shaped track as conductive region 480-12. For FIG. 4L, a wider portion of the tear-drop shaped (e.g., a smoothly rounded shaped) track is near an end 460 that is at the other end of the shape, which is connected to the perimeter 271.

The dot in each figure for FIG. 4 represents a possible point of contact of the hot conductor of the connecting probe, be it a coaxial probe, a GSG probe or some other art-recognized equivalent kind. The ground conductors of the probe will preferably connect somewhere on or outside the perimeter, or if they contact the conductive region, they should connect significantly closer to the perimeter than the hot connection. The ground connection of the probe acts as a reference, so that the signal detected is the difference in potential between the hot connection and the ground connection.

Electric and Magnetic Signal Magnitudes and Phases

Reference should be made again to FIG. 3, split into FIGS. 3A and 3B. Shown in FIG. 3B is a close up view of the fields 320, 335 and currents 370 associated with a resonator mode which has an electric field directed at the inside surface of the metal coating (not shown). The view is from the outside looking towards the surface 311 of the resonator, while the fields and currents are those immediately under the metal coating. The electric field 320 is depicted by dots, indicating a field directed towards the inside surface. The magnetic field 335 is depicted by dotted lines with arrows showing the direction. The surface current 370 is depicted by solid lines with arrows showing the direction. The charge on the inside surface is not depicted, but follows the same pattern as the electric field 320, with the sign of the charge being negative.

Consider a moment in the cycle when the electric field is directed towards the inside of the surface and is increasing in strength. Since the field 320 is directed towards the surface, the charge on that surface must be negative and because the field is increasing, the charge must also be increasing in density. This means that conventional current must be flowing away from (or electron current towards) the region of maximum negative charge density, as depicted in the current density of FIG. 3A (see the current density vector $\vec{J}$ 360). The resulting magnetic field 335 will have the direction and distribution depicted in FIG. 3B. Let an electric field 320 directed towards the surface, such as shown in FIG. 3B, be defined as a positive field, a magnetic field direction as shown in FIG. 3B be defined as a positive field, and a current directed as shown in FIG. 3B be defined as a positive current.

Consider a measurement structure consisting only of an isolated island (no bridge). The increasing electric field directed towards the island will induce current to flow out of the island into the external circuit, or if not connected to the external circuit will induce a positive voltage on the island relative to the perimeter. Let a positive voltage on the island be defined as a positive signal, and a positive electric field be defined as one directed towards the surface. The signal on the island due to the electric field is thus in-phase with the electric field. The maximum positive signal will thus occur at the instant of maximum positive electric field.

Now consider a measurement structure comprising an isolated track 380 (see FIG. 3A) grounded to the perimeter at one end. Let this structure be located such that a vector (shown as reference 340) drawn from the grounded end to the hot end is in the same direction as the current flow shown in FIG. 3A. Let a positive signal be defined as the hot end of the track having a positive potential relative to the grounded end of the track 380. At the instant considered above, the magnetic field 335 is positive, but decreasing, and the current flow is also positive, but decreasing. A conductor positioned as above, at right angles to a decreasing magnetic field, or equivalently, parallel to the associated current flow, will have a voltage induced along its length which is proportional to the time rate of change of the magnetic field, and of negative polarity. This follows from a consideration of Maxwell's equation, $\nabla \times E = -\partial B / \partial \tau$. Since the magnetic field is positive, but decreasing, the time rate of change is negative, so the hot end of the track will have a positive polarity. The maximum positive signal will occur at the instant of maximum negative rate of change of magnetic field (or current) when the current is changing sign, which corresponds also to the moment of maximum positive electric field.

Thus, the signals on an isolated island due to the electric field and the signal on an isolated track due to the magnetic field are both in phase. If the two structures are combined so that an island is added to the hot end of the track (as shown in FIG. 2B for instance), then the two voltage signals will add. However, the shunting effect of the bridge on the island signal and the shunting effect of the stray capacitance between both bridge and island and the surrounding perimeter will reduce the strength of both signals.

The most convenient instant in the cycle to consider the signs of the electric field induced and magnetic field induced signals is the quarter cycle before the instant of maximum positive electric field, such as depicted in the electric field 320 of FIG. 3B. At this instant the electric field induced signal is positive, while the magnetic field induced signal is proportional to the dot product of the surface current vector at this instant with the track direction vector (from grounded end to hot end). This is depicted in FIG. 3A, which shows the angle 350 between current 370 and track 380, while the dots 320 in FIG. 3B represent the electric field directed at the measurement structure.

It is thus convenient to consider the magnitude of the signal as the sum of an electric field induced signal and a magnetic field induced signal. The electric field induced signal is proportional to the strength of the electric field, while the magnetic field induced signal is proportional to the product of the magnetic field strength and the dot product of the track direction vector with the current density direction vector. The sensitivity of a particular measurement structure to the electric and magnetic fields will depend upon the details of that structure, such as the size and shape of the aperture, and the size, shape and location of the island and track within the aperture. They will also vary depending on the dielectric constant of the inside of the resonator and the dielectric constant of the insulator filling the measurement structure gaps.

Examples of Resonators and Modes

The electric and magnetic fields and the surface currents associated with several modes of importance in multimode filter operation are shown in FIG. 5 for the example of a cuboid multimode resonator filter component (such as that shown in FIG. 1), and in FIG. 6 for the example of a cylindrical multimode resonator filter component.

Figure 5A:
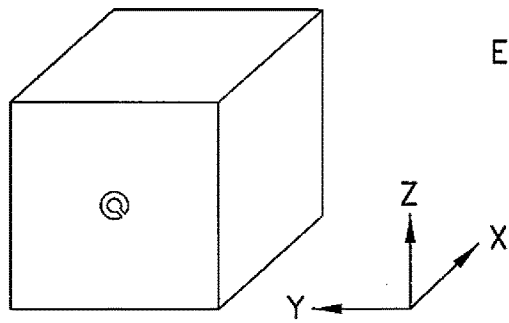
FIGS. 5A to 5Y, illustrates fields and other information for a cuboid resonator, where
Figure 5B:
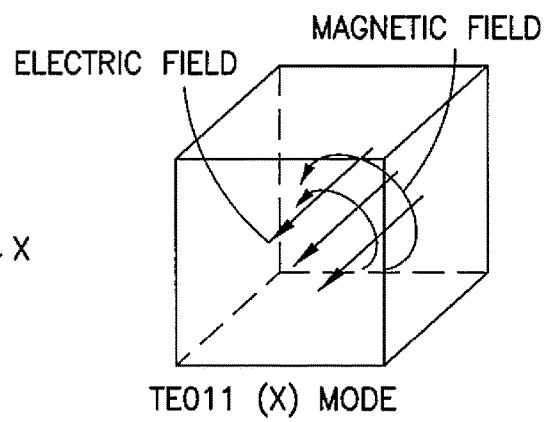
FIGS. 5B, 5C, 5D, and 5E illustrate fields and currents for the TE011 (X) mode.
Figure 5C:
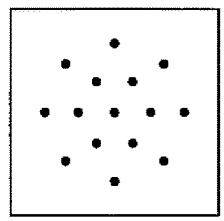

For the example of a cuboid resonator shown in FIG. 1 and FIG. 5A, five different modes are illustrated as examples. The electric and magnetic field distributions are shown in three dimensions in FIGS. 5B, 5F, 5J, 5N, 5R, and 5V for the TE011, TE101, TE110, TE021, TE012, and TE102 modes, respectively. All of these modes have an electric field passing in parallel lines from one flat face to the opposite flat face, with the magnetic field lines curling around the electric field lines. There are other modes where the electric field lines are also curved, but those are not shown in this set of examples.

Similarly, for the example of the cylindrical resonator shown in FIG. 6A, three different modes are illustrated as examples. The electric and magnetic field distributions are illustrated in three dimensions in FIGS. 6B, 6F, and 6J for the X mode, Y mode and Z mode, respectively. The X mode has the electric field parallel to the cylinder axis, with the magnetic field curling around the electric field lines. The other modes have electric fields which are perpendicular to the cylinder axis, and form a curved bundle passing across from one curved side of the cylinder to the opposite curved side. The magnetic field curls around the bundle of electric field lines.

The field distribution of most relevance to a measurement structure set into the conductive coating of a multimode resonator, such as those illustrated in FIG. 4, is that which occurs at the boundary between the ceramic and the inside surface of the conductive coating on the face on which the measurement structure is located. Let us suppose that the measurement structure is located on one of the YZ faces of either the cuboid or cylinder examples, such as shown in FIG. 5A, and FIG. 6A. For each example resonator mode, the following set of diagrams is provided: the electric field, magnetic field and surface current distribution on the YZ face. For the set of example modes, TE011, TE101, TE110, TE021, TE012, and TE102, the electric field diagrams are shown in FIGS. 5C, 5G, 5K, 5O, 5S and 5W, respectively, the magnetic field diagrams are shown in FIGS. 5D, 5H, 5L, 5P, 5T, and 5X, respectively, and the surface current diagrams are shown in FIGS. 5E, 5I, 5M, 5Q, 5U, and 5Y, respectively. Similarly, for the set of example cylinder modes, X, Y and Z, the electric field diagrams are shown in FIGS. 6C, 6G, and 6K, respectively, the magnetic field diagrams are shown in FIGS. 6D, 6H, and 6L, respectively, and the surface current diagrams are shown in FIGS. 6E, 6I, and 6M, respectively.

Some of the example modes in the figures have zero electric field on the measurement face. These are the cuboid modes, TE101, TE110, TE102 and the Y and Z transverse cylinder modes shown in FIGS. 5G, 5K, 5W, 6G, and 6K, respectively. Because the electric field is zero at the location of the measurement structure, it will not contribute any coupling between the oscillation mode and the measurement structure.

Figure 5D:
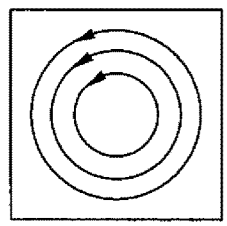
Figure 5E:
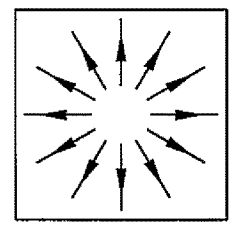

All of the example modes shown in the figures have non-zero magnetic field on the measurement face, except in the exact centre of the face in the case of the TE011 cuboid mode shown in FIG. 5D, and the axial X mode of the cylinder shown in FIG. 6D. If the measurement structure is not placed at a location of zero magnetic field and if the elongated conductive region of the measurement structure is not parallel to the direction of the magnetic field at the location of the measurement structure, then the magnetic field will contribute to the couplings between the oscillation mode and the measurement structure. This coupling will arise predominantly from the inductive coupling to the whole length of the elongated conductive region from the hot end to the grounded end where the elongated conductive region contacts the perimeter of the measurement structure aperture. This elongated region is shown in FIG. 2B (270 together with 280), 3A (340), and FIG. 4. If the conductive region has a distinct bridge, as shown in FIG. 2B (280), then this bridge will provide much of the inductive coupling.

Some of the example modes have a non-zero electric field on the measurement face. These are the cuboid mode, TE011, and the axial X mode of the cylinder, shown in FIGS. 5C, and 6C, respectively. The TE021 and TE012 modes shown in FIGS. 5O, and 5S have a line of zero electric field in the centre of the measurement face, but a non-zero electric field elsewhere. If the measurement structure is not placed at a location of zero electric field then the electric field will contribute to the couplings between the oscillation mode and the measurement structure. This coupling will arise predominantly from the capacitive coupling to the hot end of the elongated conductive region. If this region terminates in a conductive island, as shown in FIGS. 2B (270), 4A, 4B, 4C, 4E, and 4L, then this island will provide much of the capacitive coupling.

Variation of Signal with Location

For a given oscillation mode the electric and magnetic field strengths vary with the position on the measurement face, as shown in FIGS. 5 and 6. It therefore follows that the strength of the coupling between the oscillation mode and the measurement structure will vary with position. It will also vary as the cosine of the angle between the track direction vector, u, and the local direction of the surface current. This variation can be illustrated as a contour plot of the coupling strength with position on the face. FIG. 15 shows a number of such plots for measurement structures with the track oriented in the Y direction (horizontally in the figure), the Z direction (vertically in the figure) and at 45 degrees. The total coupling strength will be given by the sum of the coupling due to the electric field with the coupling due to the magnetic field. Because of the cosine dependence of the magnetic field induced signal, the contour pattern will vary as the track angle is varied.

Figure 5F:
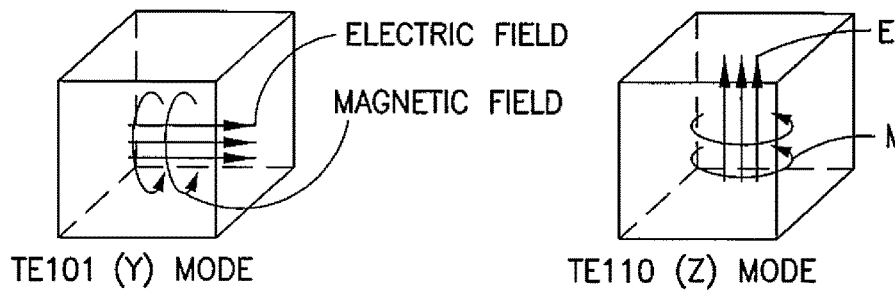
FIGS. 5F, 5G, 5H, and 5I illustrate fields and currents for the TE101 (Y) mode.
Figure 5J:
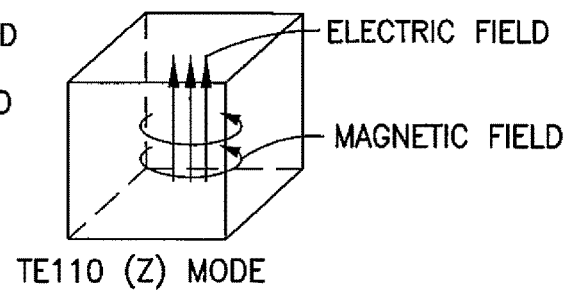
FIGS. 5J, 5K, 5L, and 5M illustrate fields and currents for the TE110 (Z) mode.
Figure 5G:
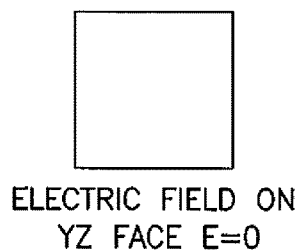
Figure 5K:
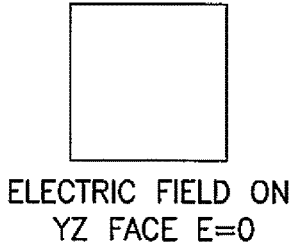
Figure 5H:
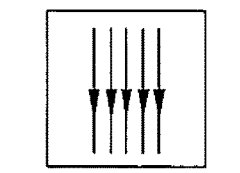
Figure 5L:
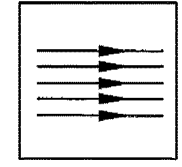
Figure 5I:
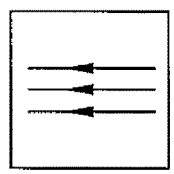
Figure 5M:
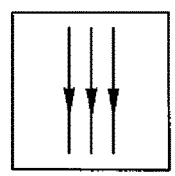
Figure 5N:
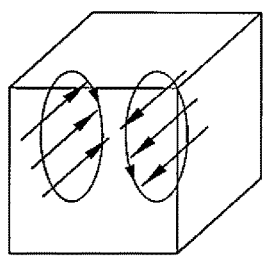
FIGS. 5N, 5O, 5P, and 5Q illustrate fields and currents for the TE021 mode.
Figure 5R:
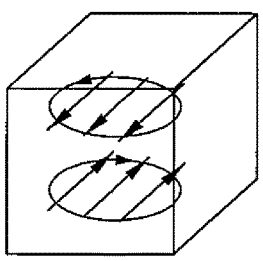
FIGS. 5R, 5S, 5T, and 5U illustrate fields and currents for the TE012 mode.
Figure 5V:
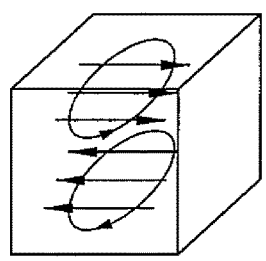
Figure 5O:
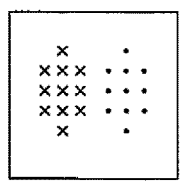
Figure 5S:
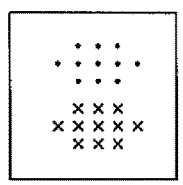
Figure 5W:
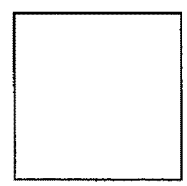
Figure 5P:
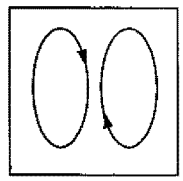
Figure 5T:
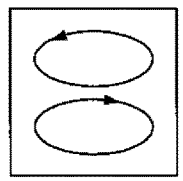
Figure 5X:
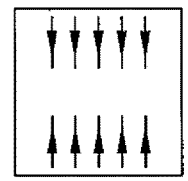
Figure 5Q:
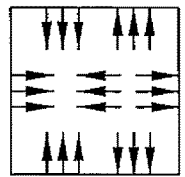
Figure 5U:
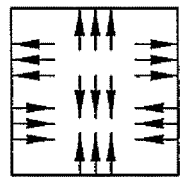
Figure 5Y:
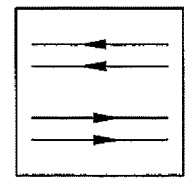
Figure 15A:
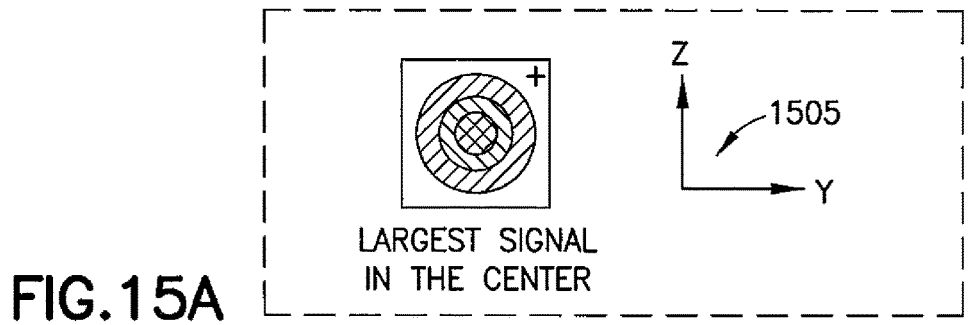
FIGS. 15A to 15O, shows contour lines of coupling strength over the surface of a cuboid resonator to illustrate the variation of coupling strength with position and track direction of the measurement structure, where FIGS. 15A to 15G correspond to the TE011 mode, FIGS. 15H to 15K correspond to the TE101 mode, and FIGS. 15L to 15O correspond to the TE101 mode, and where
Figure 15B:
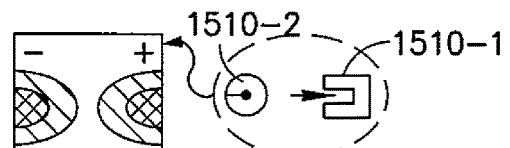
FIG. 15B shows a contour plot of the magnetic field induced coupling strength as a measurement structure (with horizontal track direction) is moved about the face.
Figure 15C:
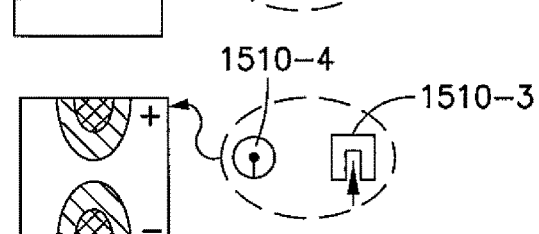
FIG. 15C shows a contour plot of the magnetic field induced coupling strength as a measurement structure (with vertical track direction) is moved about the face.
Figure 15D:
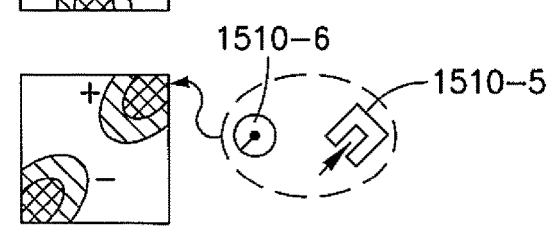
FIG. 15D shows a contour plot of the magnetic field induced coupling strength as a measurement structure (with a 45 degree track direction) is moved about the face.
Figure 15E:
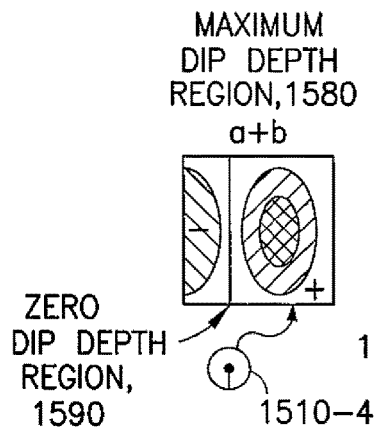
FIGS. 15E, 15F, and 15G are contour plots of total coupling strength (electric field induced and magnetic field induced) as a measurement structure is moved about a face for horizontal (15E), vertical (15F) and 45-degree (15G) track directions.
Figure 15F:
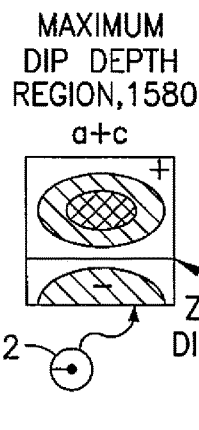
Figure 15G:
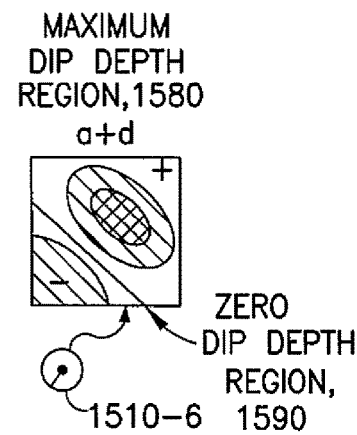
Figure 15H:
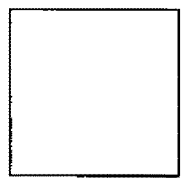
FIG. 15H illustrates a contour plot of the electric field induced coupling strength as a measurement structure is moved about the face.
Figure 15L:
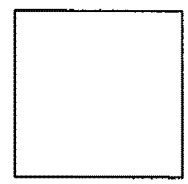
FIG. 15L illustrates a contour plot of the electric field induced coupling strength as a measurement structure is moved about the face.
Figure 15I:
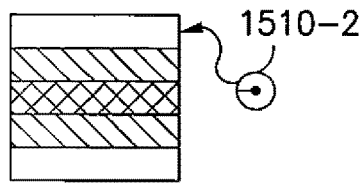
FIGS. 15I, 15J, and 15K show contour plots of the magnetic field induced coupling strength as a measurement structure with horizontal track direction (15I), vertical track direction (15J), and 45 degree track direction (15K) is moved about the face.
Figure 15M:
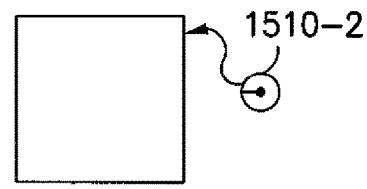
Figure 15J:
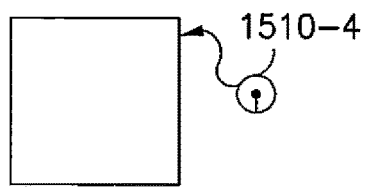
Figure 15N:
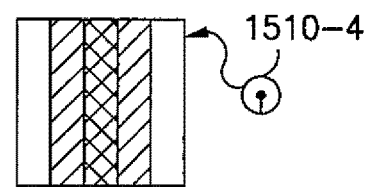
Figure 15K:
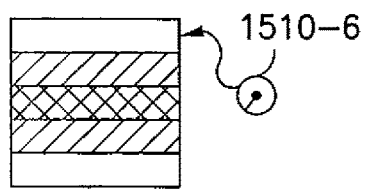
Figure 15O:
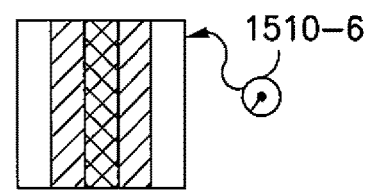

FIG. 15 shows the contour patterns for the three lowest order cuboid modes, split into FIGS. 15A to 15O. FIGS. 15A to 15G correspond to the TE011 mode as illustrated also by FIGS. 5C, 5D, and 5E; FIGS. 15H to 15K correspond to the TE101 mode as illustrated by FIGS. 5G, 5H, and 5I; and FIGS. 15L to 15O correspond to the TE101 mode as illustrated by FIGS. 5K, 5L, and 5M. The coupling due to the electric field for the TE011 mode (see also FIGS. 5C, 5D, and 5E) is shown in FIG. 15A. Specifically, FIG. 15A illustrates a contour plot of the electric field induced coupling strength as a measurement structure is moved about the face. FIG. 15A also shows a set of axes 1505 showing the orientation to be used throughout FIG. 15. The coupling strength has a maximum in the centre of the face, corresponding to the central maximum of the electric field. The coupling strength is not affected by the angle of the track. For the same mode, the coupling due to the magnetic field is strongly affected by the track angle. FIG. 15B shows the contour pattern when the track is horizontal. Specifically, FIG. 15B shows a contour plot of the magnetic field induced coupling strength as a measurement structure (with horizontal track direction) is moved about the face. Examples to illustrate the track direction of the measurement structure assumed here are shown as 1510-1 and 1510-2 in FIG. 15B. FIG. 15C shows a contour plot of the magnetic field induced coupling strength as a measurement structure (with vertical track direction) is moved about the face. Examples to illustrate the track direction are shown as 1510-3 and 1510-4 in FIG. 15C. FIG. 15D shows a contour plot of the magnetic field induced coupling strength as a measurement structure (with a 45 degree track direction) is moved about the face. Examples to illustrate the track direction are shown as 1510-5 and 1510-6 in FIG. 15D. FIGS. 15E, 15F, and 15G are contour plots of total coupling strength (electric field induced and magnetic field induced) as a measurement structure is moved about a face for horizontal (15E), vertical (15F) and 45-degree (15G) elongated regions.

The contour plot in FIG. 15B consists of two horizontally opposed regions with two maxima at the two edges. The signs of the coupling signals are shown next to the two regions. Recall that the magnetic field induced coupling is proportional to the dot product between the track direction vector and the local current direction, and observe the pattern of surface current shown in FIG. 5E. The pattern in FIG. 15B is just a contour plot of the magnitude of the horizontal component of the surface current. The total coupling will be the sum of the electric field induced coupling and the magnetic field induced coupling. Such a sum is illustrated in FIG. 15E which shows the total coupling pattern. Because the two regions shown in FIG. 15B have opposite signs, the sum with the pattern shown in FIG. 15A gives rise to a maximum (shown as maximum coupling strength region 1580) displaced to the right of centre in FIG. 15E, and also to a region on the face where the total coupling will be zero (illustrated by zero coupling strength region 1590). The exact locations of the zero signal region and the maximum signal region will depend on the exact details of the shape of the structure, the shape of the resonator and the dielectric constant of the resonator, but the general features of the patterns are as shown. If the track direction vector is vertical, the magnetic field induced coupling contour pattern is as shown in FIG. 15C. Now the pattern is a contour plot of the magnitude of the vertical component of the surface current shown in FIG. 5E, and when summed with the electric field induced coupling pattern shown in FIG. 15A gives rise to a total coupling pattern shown in FIG. 15F. Finally, if the track direction vector is at an intermediate angle, say 45 degrees to the horizontal, then the magnetic field induced coupling pattern is as shown in FIG. 15D and when summed as before yields the total coupling pattern shown in FIG. 15G. All of these total coupling patterns have a zero signal region and an off-centre maximum signal region. Clearly one would not place the measurement structure anywhere on the zero total coupling region. To maximize the signal one might place it in the maximum signal region, but consideration of coupling strengths to other modes may alter the optimum location.

The TE101 and TE110 modes have zero electric field on the measurement face, so the electric field induced coupling will be zero, as shown in FIGS. 15H and 15L. Thus the total coupling will be identical with the magnetic field induced coupling. The above modes have a diffuse band of current concentrated across the middle of the face, horizontal in the case of TE101, as shown in FIG. 5I, and vertical in the case of TE110, as shown in FIG. 5M. A measurement structure with a horizontal track will therefore couple to TE101 (see FIG. 15I) but not TE110 (see FIG. 15M), while a structure with a vertical track will couple to TE110 (see FIG. 15N) but not TE101 (see FIG. 15J). A track at 45 degrees will couple to both modes, as shown in FIGS. 15K and 15O. In order to achieve a useful amount of coupling to both modes the measurement structure must not be too far away from the centre. If the measurement structure is to couple to all three modes then the track must not be horizontal or vertical, but must be at an intermediate angle, for example 45 degrees, and it also must not be located in the zero coupling regions illustrated in FIG. 15E, 15F or 15G. A centrally located structure will avoid the zero region, but a location offset towards the maximum coupling region shown in FIG. 15G will produce a stronger signal.

Example Signals

In the case where the measurement structure is connected to a vector network analyser (VNA) the variation of coupling strength with frequency which occurs in the vicinity of a resonance will be detected as a dip in the reflected power. The depth of this dip will represent the strength of the coupling, so the stronger the coupling the deeper the dip. The frequency at which the dip occurs constitutes the measurement of the mode frequency. Multiple modes will give rise to multiple dips, allowing measurement of the frequencies of all of the modes.

If the modes of interest are the three lowest order modes of a cuboid resonator, then a convenient location for the measurement structure is the center of one of the faces. Referring back to FIG. 2 (split into FIGS. 2A and 2B), let the structure 210 be placed in the center of one of the X faces. If the bridge angle 230 is set to 45 degrees then the total coupling strength for each of the Y and Z modes will be approximately equal. As a result, the dip depth occurring for each of the modes will be approximately equal.

Figure 8A:
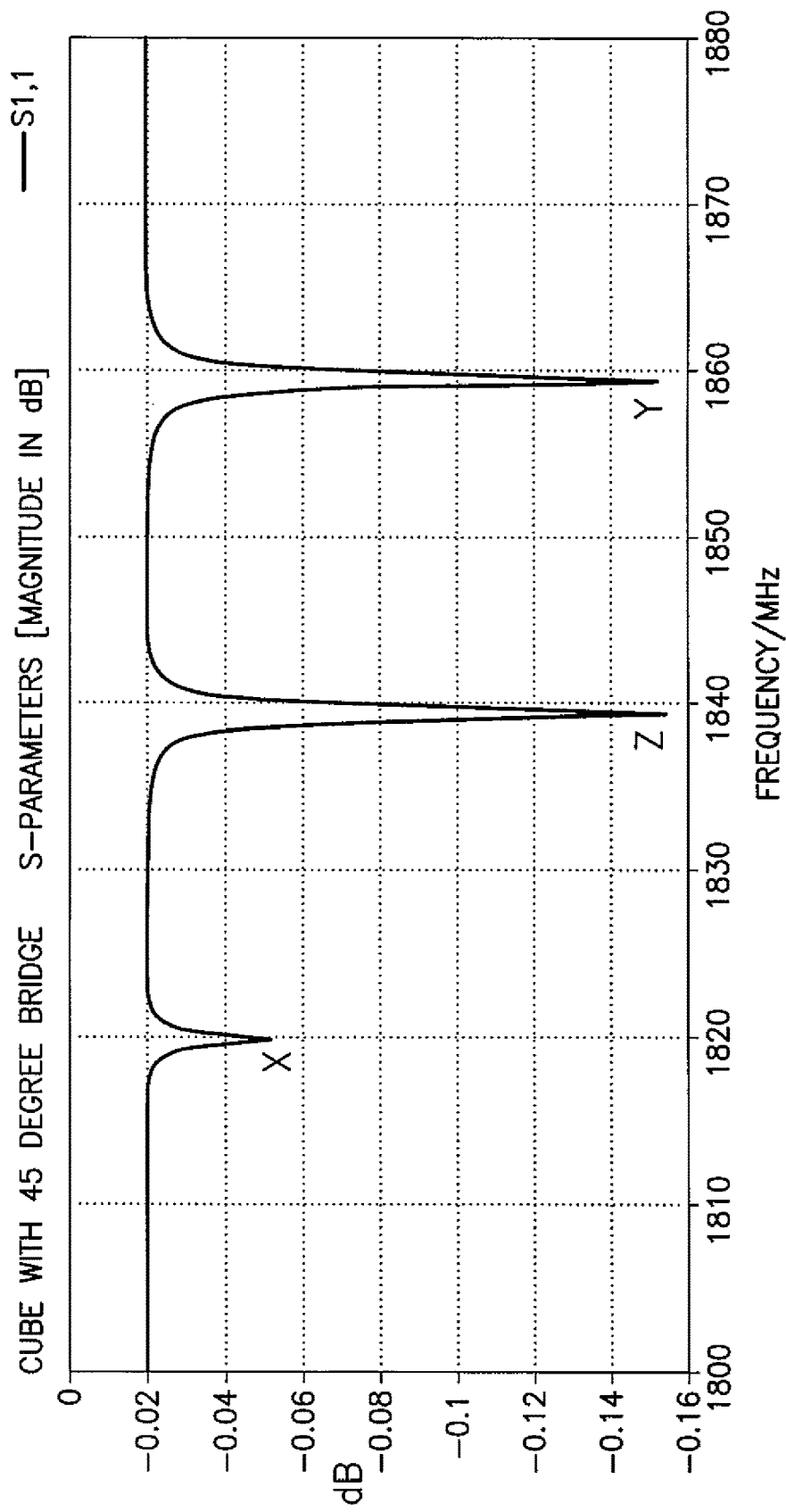
FIGS. 8A and 8B, illustrates S-parameters (in dB versus frequency) for cubes with a 45 degree bridge (FIG. 8A) and a 37 degree bridge (FIG. 8B)
Figure 8B:
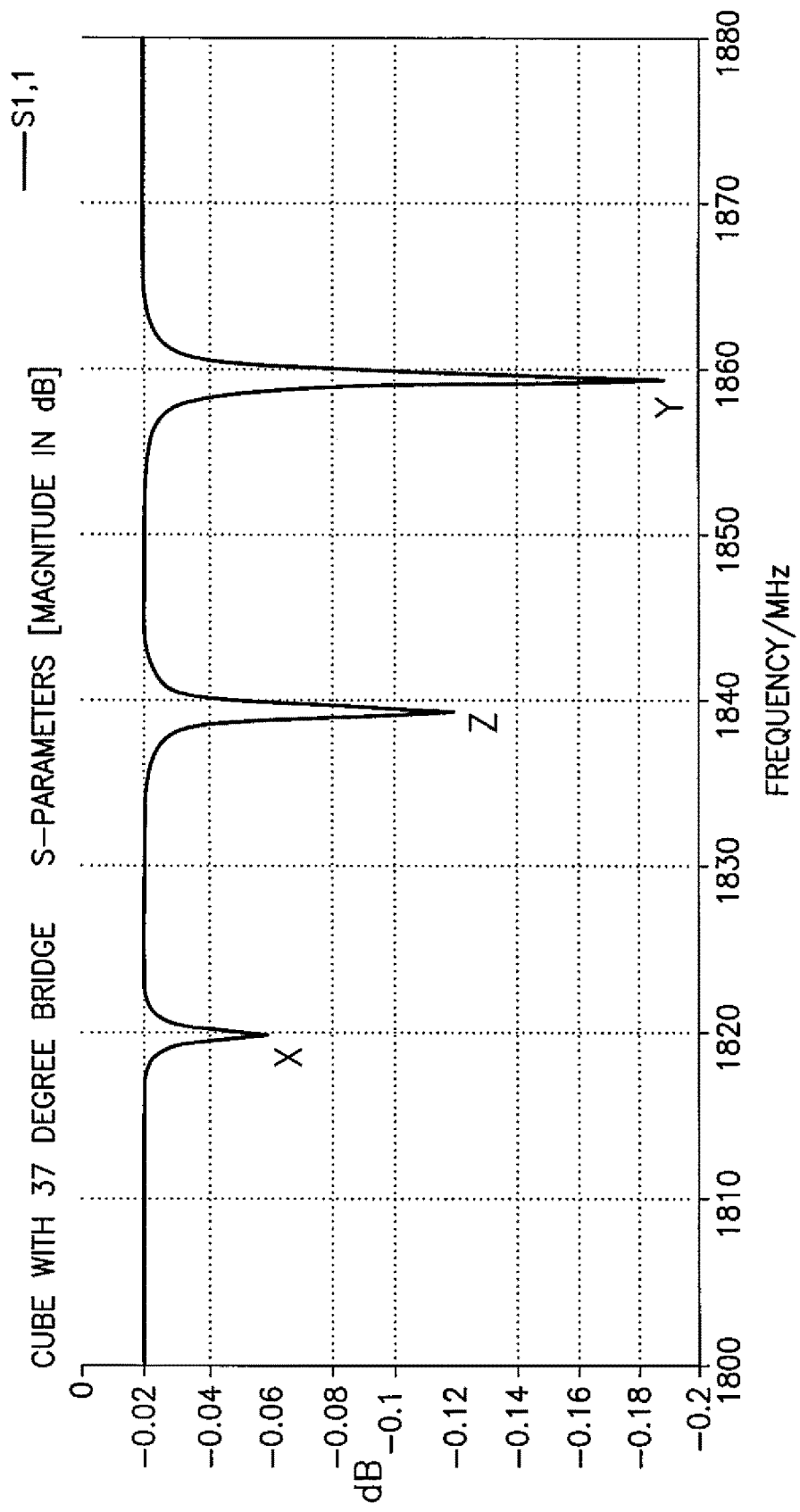

An example of such a measured signal is shown in FIG. 8A. FIG. 8 includes FIGS. 8A and 8B, and illustrates S-parameters (in dB versus frequency) for cubes with a 45 degree bridge (FIG. 8A) and a 37 degree bridge (FIG. 8B). The lowest frequency dip is the X mode, the next dip is the Z mode and the highest frequency dip is the Y mode. Note that the depths of the dips are not the same. By changing the angle 230 of the bridge 280 relative to the Y axis 272 in FIG. 2, the relative heights of the Y mode and Z mode dips can be varied, with approximate equality occurring at 45 degrees, as seen in FIG. 8A. The X mode dip is smaller than the other two. If the measurement structure 210 is placed in the center of the one of the faces of the cuboid resonator 100, and the angle of the bridge 280 is set to about 37 degrees to the Y axis 272, rather than the more obvious and symmetrical 45 degrees, then the amplitudes of the dips form a sequence in the order X smallest, Z intermediate and Y largest, which can assist in the identification of the dips during a frequency measurement. This signal is illustrated in FIG. 8B.

The use of a carefully chosen bridge angle 230 to provide identification of the modes corresponding to each dip provides a particular advantage in situations where the multi-mode resonator 100 has two or more mode frequencies which are sufficiently close that they may overlap or even cross during the tuning process. In such a situation, the ability to unambiguously identify the modes based only on the dip amplitudes avoids the need for auxiliary mode identification procedures, such as provision of an additional measurement structure elsewhere on the resonator.

Other Resonator Shapes

Even though the description above concentrated on the case of a cuboid resonator, the measurement structure disclosed here can be used to measure the mode frequencies of any resonator consisting of a dielectric block with a metal coating. The structure only depends for its operation on the presence of electric and/or magnetic fields, and since all such resonators will necessarily have such fields, this structure will work with any of them.

Examples of such alternative resonators are cylinders, spheres, half spheres, pyramids, toroids, and any other dielectric resonator with a metal coating.

Further Examples

All of these further examples are based around a standard example with the following parameters:
dielectric constant, er=45;
size X,Y,Z=17.7, 18.0, 18.3 mm;
keyhole in centre of YZ face;
aperture diameter=1.6 mm;
bridge width=0.3 mm;
island diameter=1.0 mm (follows from gap width); and
bridge angle 45 degrees to the Y axis.

Certain of these parameters are then varied with the others kept the same and the coupling strengths plotted vs the varied parameter.

FIG. 9 shows a graph of dip depth vs bridge angle. At 45 degrees, the Y and Z mode dips are equal because the bridge is always at 45 degrees to the current direction, regardless of whether the direction is the Y or Z mode. The X mode dip depth remains constant because for this mode the keyhole couples only to the electric field (the magnetic field being zero), and this coupling is insensitive to bridge orientation. If the angle is chosen to be about 35 degrees (or 37 as in FIG. 8B) it is plain to see that the three dips have different depths in a nice well-spread sequence.

Figure 10:
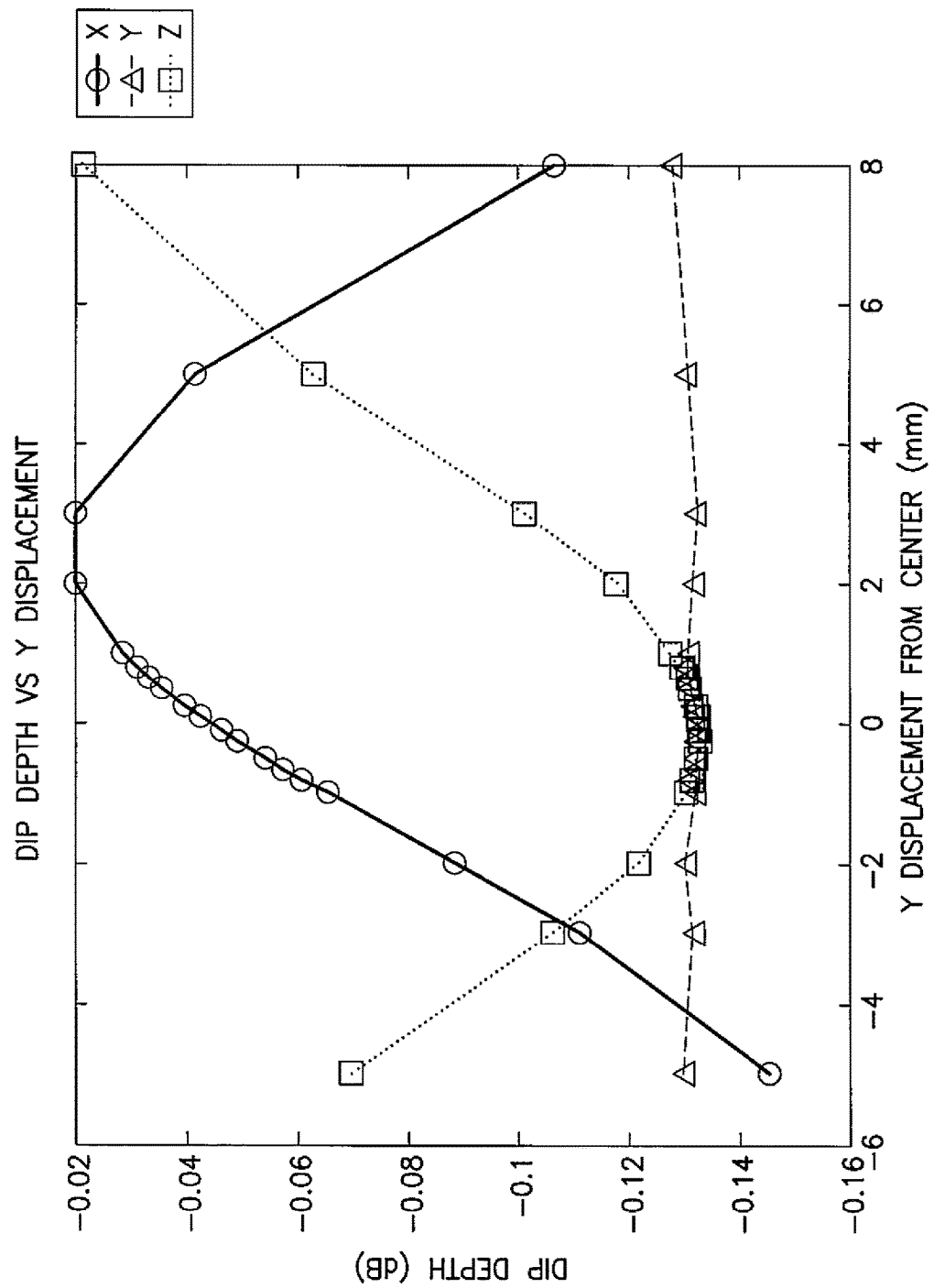
FIG. 10 shows a graph of dip depth versus displacement of the keyhole away from the centre of the YZ face in the Y direction for an exemplary embodiment.

FIG. 10 shows a graph of dip depth versus displacement of the keyhole away from the centre of the YZ face in the Y direction. The bridge angle is kept at 45 degrees. Since the current for the Y mode is running along the face in the Y direction the dip depth for this mode does not vary (much) with displacement. The small variation is probably a numerical artefact from the electromagnetic simulation. In a real experiment, the dip depth would stay quite constant (at least for a small key). The Z mode dip depth is greatest when the key is in the centre. This is because the stripe of current running across the face in the Y direction decreases in strength away from the centre line in the Z direction. The most interesting part of this plot is the X mode dip depth. Note that it goes to zero at about 2 or 3 mm away from centre. The reason for this is discussed above in relation to the contour plots of the variation of total coupling strength as the measurement structure is moved about the face. The plot corresponds to a horizontal cut across the centre of the contour plot in FIG. 15G, but flipped.

Figure 11:
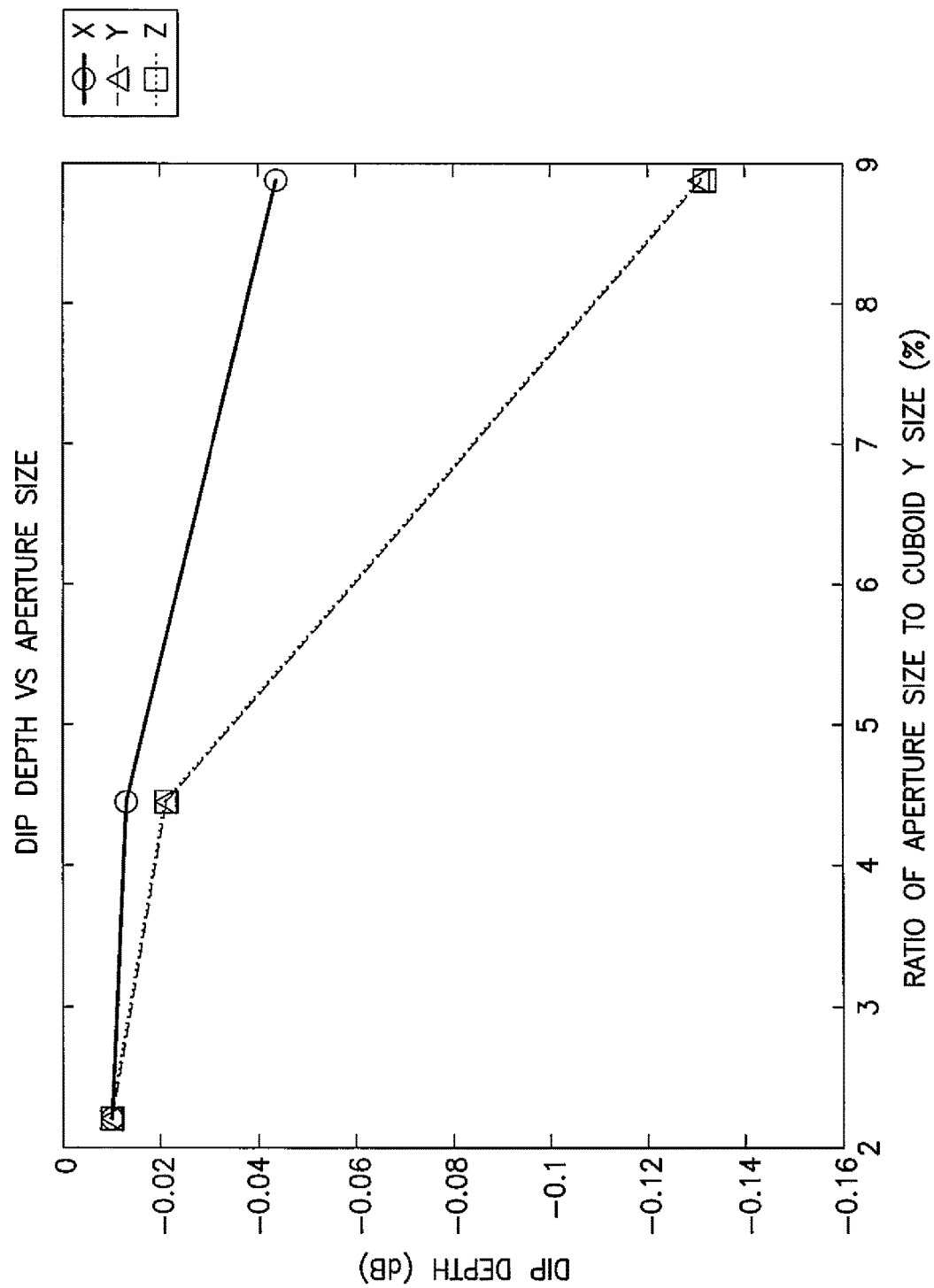
FIG. 11 shows a graph of dip depth versus keyhole size (or equivalently, aperture size) relative to the face Y width for an exemplary embodiment.

FIG. 11 shows a graph of dip depth versus keyhole size (or equivalently, aperture size) relative to the face Y width. A smaller keyhole gives a smaller dip than a larger keyhole because the keyhole intercepts less of the internal fields if the keyhole is small. Additional calculations for really large keyholes have been performed, but the signals are more difficult to analyze. The other two sizes were 18% and 36% of the face width, and the signals for these were highly variable. It is recommended therefore that one wants the keyhole to be relatively small to keep the disturbance to the mode frequencies small.

Figure 12:
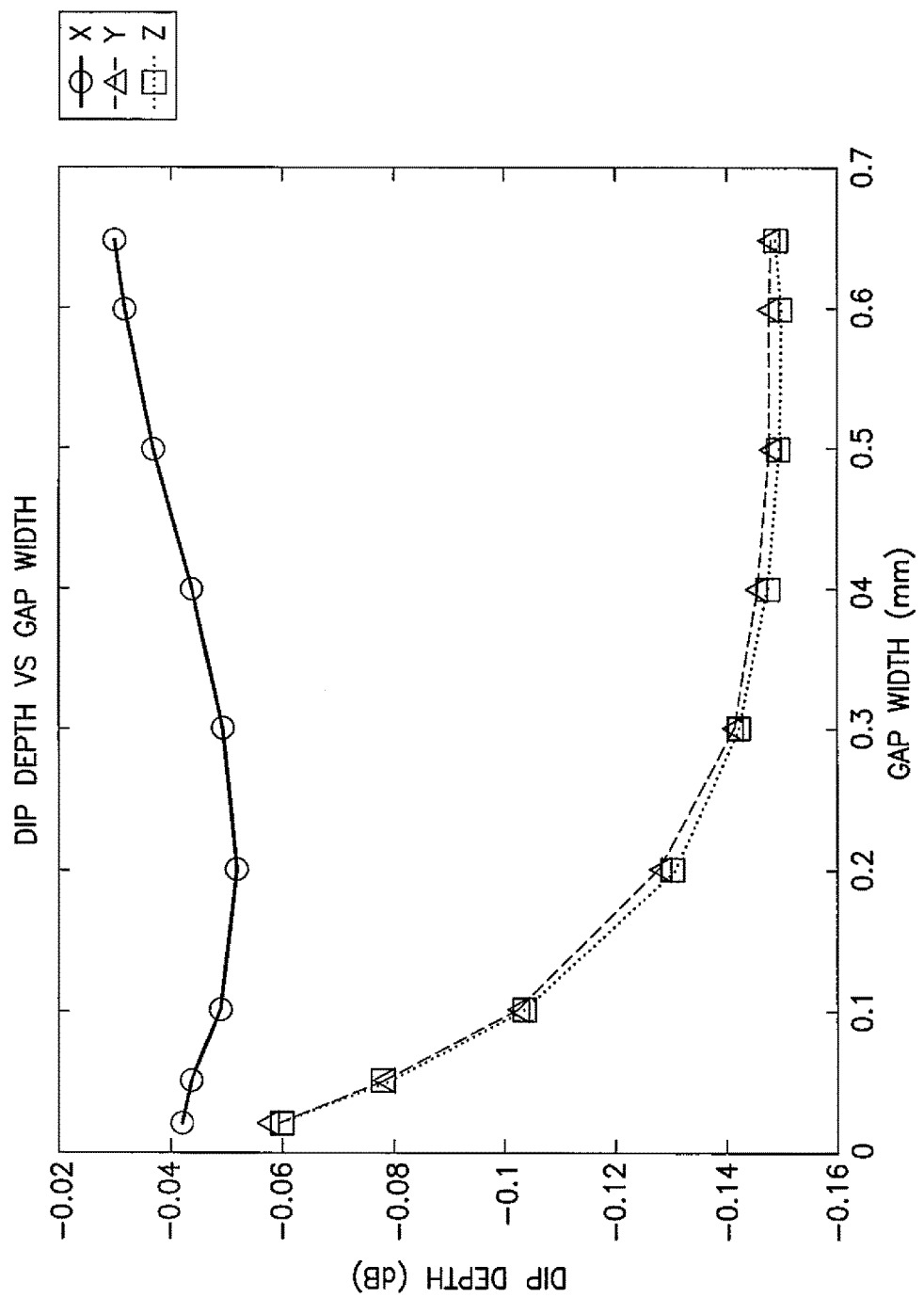
FIG. 12 shows a graph of dip depth versus the width of the gap between aperture perimeter and island in an exemplary embodiment.

FIG. 12 shows a graph of dip depth versus the width of the gap between aperture perimeter and island. Equivalently the island diameter is being varied, so these keyholes are a sequence like FIG. 4A to FIG. 4D. As the gap gets smaller, it corresponds to an effective shortening of the bridge, so the Y and Z mode dips (which are produced by coupling to the magnetic field) get smaller because not so much of the field is intercepted. A smaller gap also increases the shunt capacitance from island to grounded perimeter, so this further reduces the dip depth. A smaller gap corresponds to a larger island area and so a larger area of electric field being intercepted, so smaller gaps should lead to larger X mode dips, however the increasing shunt capacitance opposes this. As a result, the X mode dip depth is fairly constant as the gap is varied.

Figure 13:
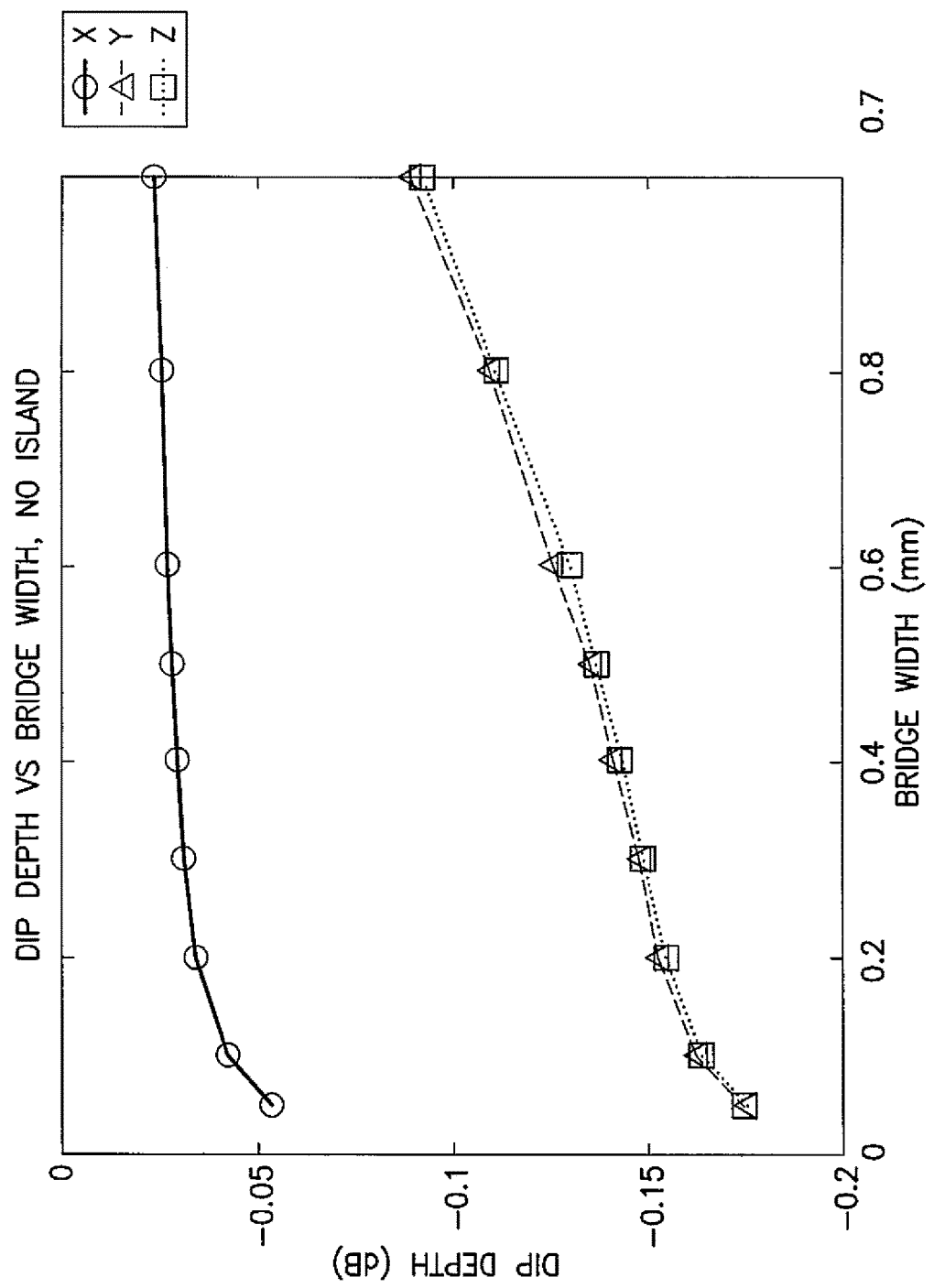
FIG. 13 shows a graph of dip depth versus the width of the bridge for an exemplary embodiment.

FIG. 13 shows a graph of dip depth versus the width of the bridge, but the diameter of the island has also been varied in such a way that diameter is always the same width as the bridge. As a result, the keyhole here effectively lacks an island, instead consisting of a simple track (with rounded end) running halfway across the aperture. This corresponds to FIG. 4D. The bridge length is approximately the same for all, except for the slight increase due to the rounded end. As the width decreases, the inductance increases which decreases the severity of the inductive shunting of the capacitive, or electric field signal (the X mode dip), so this should increase the X mode dip. Opposed to this is that the effective area of the tip region is also decreasing, which decreases the coupling to the electric field and hence the dip depth. As a result, the X mode dip depth is somewhat constant. The increase in the Y and Z mode dips as the width increases can be understood as resulting from the bridge presenting a larger "scoop" to collect the current rushing along the surface. This one is actually fairly complicated because a lot of opposing effects are occurring.

Figure 14:
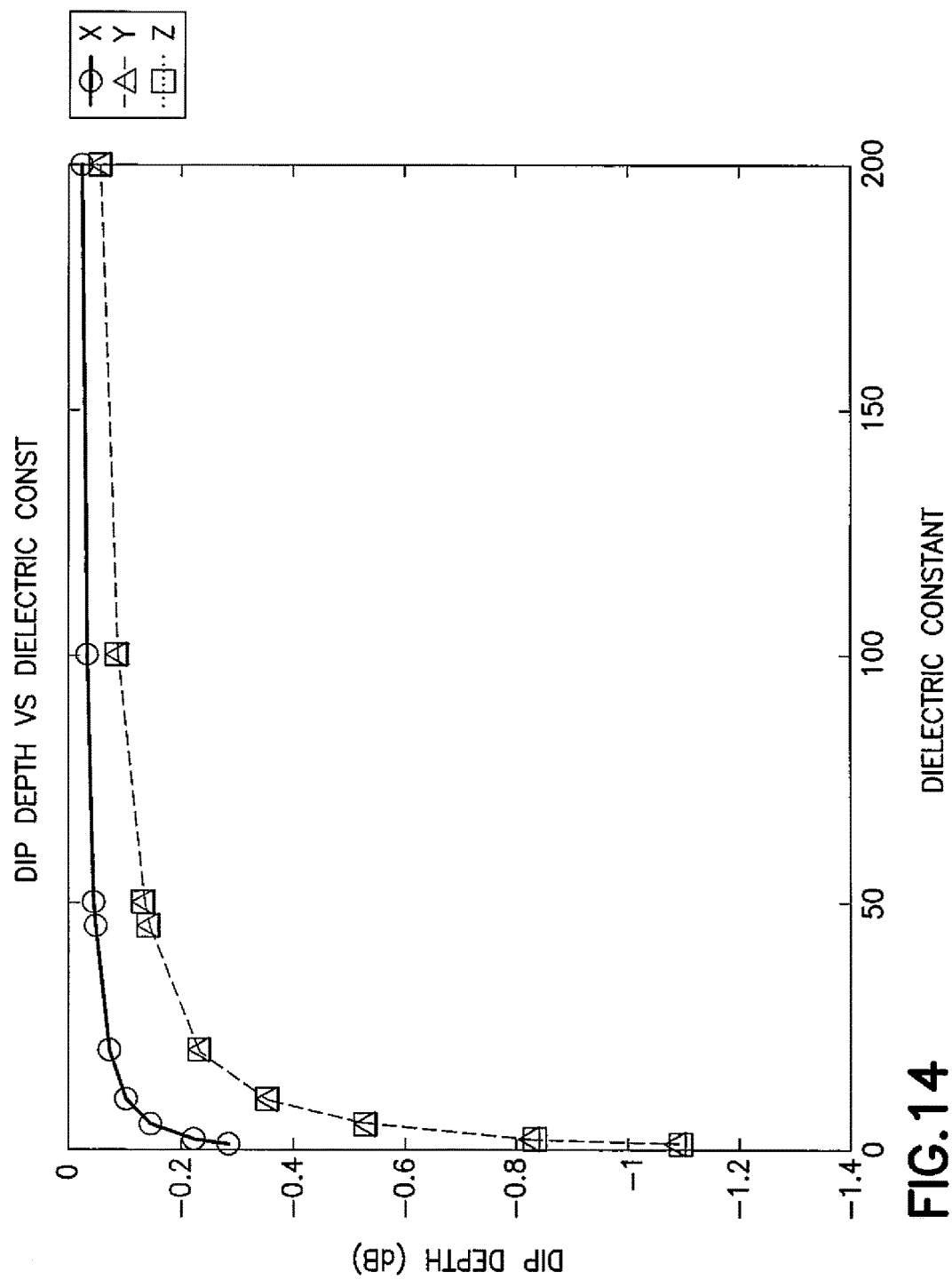
FIG. 14 shows the dip depth versus dielectric constant of the cuboid in an exemplary embodiment.

FIG. 14 shows the dip depth versus dielectric constant of the cuboid. One way to think of this graph is that an electromagnetic field in vacuum stores all of its energy as the fields themselves, whereas a dielectric material stores some of its energy as the polarization of the dielectric. The larger the dielectric constant, the larger the fraction stored as polarization. This makes a smaller portion of the energy circulating inside the resonator impinge on the keyhole, so the coupling is weaker.

Without in any way limiting the scope, interpretation, or application of the claims appearing below, a technical effect of one or more of the example embodiments disclosed herein is to provide measurement structures that can be used measurements such as frequency and quality factors of resonators and other devices. The measurement structures may be used in particular with resonators such as cuboid or cylindrical resonators.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus comprising:
    a measurement structure for performing measurements of a radio frequency (RF) device, the measurement structure comprising:
        a conductive surface, said conductive surface being disposed on an RF device;
        an aperture in the conductive surface, the aperture having a substantially the same width in all dimensions; and
        a conductive island region projecting into the aperture from a conductive perimeter of the aperture and electrically connected to the conductive perimeter,
    wherein the aperture and the conductive island region do not together have a shape possessing even rotational symmetry about a point where a signal conductor will be placed on the conductive island region in order to conduct RF energy between the measurement structure and an external measurement instrument for performing the measurements.

2. The apparatus of claim 1, wherein:
    the measurement structure is performing measurements of a multimode resonator, the measurements comprising at least one of resonant frequencies and quality factors of resonant modes of the resonator;
    the aperture is in a conductive surface of the multimode resonator; and
    the measurement structure is positioned on the multimode resonator at a location where the electric field, the magnetic field, or both the electric field and the magnetic field corresponding to each mode of interest is of a magnitude to create a measurable result for the measurements.

3. The apparatus of claim 2, further comprising the external measurement instrument that is configured to exchange energy with the measurement structure and thereby to exchange RF energy with the multimode resonator such that a variation in energy exchange with frequency is measured and the at least one of the resonant frequencies and the quality factors of the resonant modes are determined.

4. The apparatus of claim 1, further comprising the signal conductor that contacts the point and a second conductor spaced away from the signal conductor and used as a reference.

5. The apparatus of claim 4, further comprising a single ended probe wherein a hot conductor of the probe comprises the signal conductor and a ground conductor of the probe is the second conductor used as a reference.

6. The apparatus of claim 4, further comprising a differential probe wherein one conductor of the probe comprises the signal conductor and another conductor of the probe is the second conductor used as a reference.

7. The apparatus of claim 2, further comprising a probe comprising a coaxial contact to the resonator, wherein a center contact of the probe touches the point while a surrounding shield makes contact with a grounded perimeter in the conductive surface of the multimode resonator.

8. The apparatus of claim 1, further comprising a probe comprising a pair of pins, wherein one of the pins contacts the point and another of the pins is spaced apart from the point.

9. The apparatus of claim 1, further comprising a probe comprising three pins, wherein one of the pins contacts the point and the others of the pins are spaced apart from the point.

10. The apparatus of claim 2, further comprising a probe, a strip line comprising the signal conductor and configured to be coupled to the probe, and an instrument mounted integrally with the probe to perform at least part of the measurements.

11. The apparatus of claim 2, wherein the conductive island region comprises an island and a bridge, the bridge projecting into the aperture from the conductive perimeter of the aperture to electrically connect the island to the conductive perimeter, the island having a similar width in all dimensions that is larger than a width of the bridge.

12. The apparatus of claim 11, wherein the island is shaped as one of the following: a circle; a square; a polygon; or an oval.

13. The apparatus of claim 12, wherein the island is shaped as a circle.

14. The apparatus of claim 12, wherein the island is shaped as a square.

15. The apparatus of claim 11, wherein the measurement structure is positioned on the multimode resonator at a location selected, along with a selection of a bridge angle, to make amplitudes of all mode dips different, which assists in mode identification.

16. The apparatus of claim 11, wherein the island is a structure centrally located in the aperture, with the bridge at an angle of 37 degrees for a resonator of cuboid shape.

17. The apparatus of claim 2, wherein an orientation of the conductive island region is chosen such that the orientation is not substantially parallel to a magnetic field of any mode of interest which has zero electric field.

18. The apparatus of claim 3, wherein the measurement instrument comprises a vector network analyzer and frequency measurement is performed by measuring dips in reflected RF energy as the vector network analyzer sweeps past one or more of the resonant frequencies of the resonant modes of the resonator.

19. The apparatus of claim 2, wherein the conductive island region comprises a tear-drop shaped track projecting into the aperture from the conductive perimeter of the aperture, said tear-drop shaped track having a smoothly rounded shape and being wider within the aperture than at the conductive perimeter.

* * * * *

UNITED STATES PATENT AND TRADEMARK OFFICE
CERTIFICATE OF CORRECTION

PATENT NO. : 10,288,656 B2  
APPLICATION NO. : 15/364559  
DATED : May 14, 2019  
INVENTOR(S) : Steven Cooper, David Hendry and Chris Boyle Page 1 of 1

It is certified that error appears in the above-identified patent and that said Letters Patent is hereby corrected as shown below:

In Claim 3:
Column 18, Line 5, "that is configured" should be deleted and --configured-- should be inserted.

Signed and Sealed this
Ninth Day of July, 2019

Andrei Iancu
*Director of the United States Patent and Trademark Office*